United States Patent
Ramkumar et al.

(10) Patent No.: US 11,355,185 B2
(45) Date of Patent: Jun. 7, 2022

(54) SILICON-OXIDE-NITRIDE-OXIDE-SILICON MULTI-LEVEL NON-VOLATILE MEMORY DEVICE AND METHODS OF FABRICATION THEREOF

(71) Applicant: Cypress Semiconductor Corporation, San Jose, CA (US)

(72) Inventors: Krishnaswamy Ramkumar, San Jose, CA (US); Venkatraman Prabhakar, Pleasanton, CA (US); Vineet Agrawal, San Jose, CA (US); Long Hinh, San Jose, CA (US); Santanu Kumar Samanta, West Bengal (IN); Ravindra Kapre, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/827,924

(22) Filed: Mar. 24, 2020

(65) Prior Publication Data
US 2021/0159346 A1 May 27, 2021

Related U.S. Application Data

(60) Provisional application No. 62/940,547, filed on Nov. 26, 2019.

(51) Int. Cl.
*G11C 11/56* (2006.01)
*G06N 3/063* (2006.01)
(Continued)

(52) U.S. Cl.
CPC ........ *G11C 11/5671* (2013.01); *G06N 3/0635* (2013.01); *G11C 16/0483* (2013.01);
(Continued)

(58) Field of Classification Search
CPC ......... H01L 27/11524; H01L 27/11529; H01L 27/1157; H01L 27/11573; H01L 27/11568;
(Continued)

(56) References Cited

U.S. PATENT DOCUMENTS 4,627,027 A * 12/1986 Rai .................. G11C 16/14
5,239,500 A * 8/1993 Oguey .............. G11C 27/005
257/321

(Continued)

OTHER PUBLICATIONS

International Search Report for International Application No. PCT/US20/61924 dated Feb. 9, 2021; 2 pages.
(Continued)

*Primary Examiner* — Sitaramarao S Yechuri

(57) ABSTRACT

A semiconductor device that has a silicon-oxide-nitride-oxide-silicon (SONOS) based non-volatile memory (NVM) array including charge-trapping memory cells arranged in rows and columns and configured to store one of N×analog values. Each charge-trapping memory cells may include a memory transistor including an angled lightly doped drain (LDD) implant extends at least partly under an oxide-nitride-oxide (ONO) layer of the memory transistor. The ONO layer disposed within the memory transistor and over an adjacent isolation structure has the same elevation substantially.

24 Claims, 24 Drawing Sheets

(51) Int. Cl.
*G11C 16/04* (2006.01)
*G11C 16/08* (2006.01)
*G11C 16/16* (2006.01)
*G11C 16/24* (2006.01)
*G11C 16/26* (2006.01)
*G11C 16/34* (2006.01)
*H01L 27/11524* (2017.01)
*H01L 27/11529* (2017.01)
*H01L 27/1157* (2017.01)
*H01L 27/11573* (2017.01)
*H01L 29/66* (2006.01)
*H01L 29/78* (2006.01)
*H01L 29/792* (2006.01)

(52) U.S. Cl.
CPC .............. *G11C 16/08* (2013.01); *G11C 16/16* (2013.01); *G11C 16/24* (2013.01); *G11C 16/26* (2013.01); *G11C 16/3445* (2013.01); *G11C 16/3459* (2013.01); *H01L 27/1157* (2013.01); *H01L 27/11524* (2013.01); *H01L 27/11529* (2013.01); *H01L 27/11573* (2013.01); *H01L 29/6659* (2013.01); *H01L 29/66833* (2013.01); *H01L 29/7833* (2013.01); *H01L 29/7923* (2013.01)

(58) Field of Classification Search
CPC ........... H01L 29/6659; H01L 29/66833; H01L 29/7833; H01L 29/7923; H01L 29/42344; G06N 3/0635; G11C 11/5671; G11C 11/5628; G11C 11/5635; G11C 11/5642; G11C 2211/5621; G11C 16/0483; G11C 16/08; G11C 16/16; G11C 16/24; G11C 16/26; G11C 16/3459; G11C 16/3445; G11C 16/3495; G11C 16/30; G11C 16/10; G11C 16/0466
See application file for complete search history.

(56) References Cited

U.S. PATENT DOCUMENTS

| | | | |
|---|---|---|---|
| 5,680,341 | A * | 10/1997 | Wong .................. G11C 27/005 365/45 |
| 6,493,266 | B1 | 12/2002 | Yachareni et al. |
| 6,531,350 | B2 | 3/2003 | Satoh et al. |
| 7,056,704 | B2 | 6/2006 | Tuschl et al. |
| 7,198,396 | B2 | 4/2007 | Isaacson |
| 7,656,704 | B2 | 2/2010 | Chen et al. |
| 7,923,363 | B2 | 4/2011 | Goarin et al. |
| 7,948,020 | B2 | 5/2011 | Roizin et al. |
| 8,916,432 | B1 | 12/2014 | Ramkumar et al. |
| 9,202,701 | B1 | 12/2015 | Chou et al. |
| 9,466,384 | B1 | 10/2016 | Chang et al. |
| 9,721,962 | B1 | 8/2017 | Ramkumar |
| 9,922,988 | B2 | 3/2018 | Ramkumar et al. |
| 2003/0197203 | A1* | 10/2003 | Yi .......................... G11C 16/16 257/200 |
| 2003/0198086 | A1 | 10/2003 | Shukuri |
| 2011/0124173 | A1* | 5/2011 | Kim .................. H01L 27/10873 438/305 |
| 2017/0263622 | A1 | 9/2017 | Ramkumar et al. |
| 2019/0013324 | A1* | 1/2019 | Shih .................. H01L 27/11568 |

OTHER PUBLICATIONS

International Search Report for International Application No. PCT/US2020/061907 dated Apr. 12, 2021; 5 pages.
USPTO Notice of Allowance for U.S. Appl. No. 16/827,948 dated Jan. 22, 2021; 9 pages.
Written Opinion of the International Searching Authority for International Application No. PCT/US2020/061907 dated Apr. 12, 2021; 5 pages.
Written Opinion of the International Searching Authority for International Application No. PCT/US2020/061924 dated Feb. 9, 2021; 6 pages.

* cited by examiner

Erase Operation
(Page/Row 0 Selected to be Erased,
Page/Row 1 Unselected)

| WLS0 | BL0 | WL0 | SPW | DNW | CSL0 | WLS1 | BL1 | WL1 |
|---|---|---|---|---|---|---|---|---|
| $V_{NEG}$ | $V_{POS}$ | $V_{PWR}$ | $V_{POS}$ | $V_{POS}$ | $V_{POS}$ | $V_{POS}$ | $V_{POS}$ | $V_{PWR}$ |
| e.g. −3.8V | e.g. +4.2V | e.g. +1.1V | e.g. +4.2V | e.g. +1.1V | e.g. +4.2V | e.g. +4.2V | e.g. +4.2V | e.g. +1.1V |

WLS Pulse duration: Te ~ 10 ms

SILICON-OXIDE-NITRIDE-OXIDE-SILICON MULTI-LEVEL NON-VOLATILE MEMORY DEVICE AND METHODS OF FABRICATION THEREOF

CROSS-REFERENCE TO RELATED APPLICATIONS

The present application claims the priority and benefit under 35 U.S.C. § 119(e) of U.S. Provisional Application No. 62/940,547, filed on Nov. 26, 2019, which is incorporated by reference herein in its entirety.

TECHNICAL FIELD

The present disclosure relates generally to non-volatile memory devices, and more particularly to silicon (semiconductor)-oxide-nitride-oxide-silicon (semiconductor) (SONOS) based multi-level charge-trapping non-volatile memory (NVM) memory and inference devices and fabrication methods thereof.

BACKGROUND

Non-volatile memories are widely used for storing data in computer systems, and typically include a memory array with a large number of memory cells arranged in rows and columns. In some embodiments, each of the memory cells may include at least a non-volatile element, such as charge trapping field-effect transistor (FET), floating gate transistor, that is programmed or erased by applying a voltage of the proper polarity, magnitude and duration between a control/memory gate and the substrate or drain/source regions. For example, in an n-channel charge trapping FET, a positive gate-to-substrate voltage causes electrons to tunnel from the channel and trapped in a charge-trapping dielectric layer by Fowler-Nordheim (FN) tunneling, raising a threshold voltage ($V_T$) of the transistor. A negative gate-to-channel voltage causes holes to tunnel from the channel and trapped in the charge-trapping dielectric layer, lowering the $V_T$ of the SONOS transistor.

In some embodiments, SONOS based memory arrays are utilized and operated as digital data storage devices wherein binary bit (0 and 1) data, based on the SONOS cells' two distinct $V_T$ or drain current ($I_D$) levels or values, are stored.

There are demands to use NVM technology, such as SONOS, for analog memory and processing as they possess configurable multiple distinct $V_T$ and $I_D$ (more than two) levels with achievably high precision. SONOS memory cells deliver low latency, power, and noise operations that are desirable for analog processing, including at edge inference computations, such as neuromorphic computing in artificial intelligence (AI) applications.

It is, therefore, an object of the present invention to integrate multi-level SONOS cell fabrication into baseline complementary metal oxide semiconductor (CMOS) process flow.

BRIEF DESCRIPTION OF THE DRAWINGS

The present invention will be understood more fully from the detailed description that follows and from the accompanying drawings and the appended claims provided below, where:

DETAILED DESCRIPTION

Figure 1A:
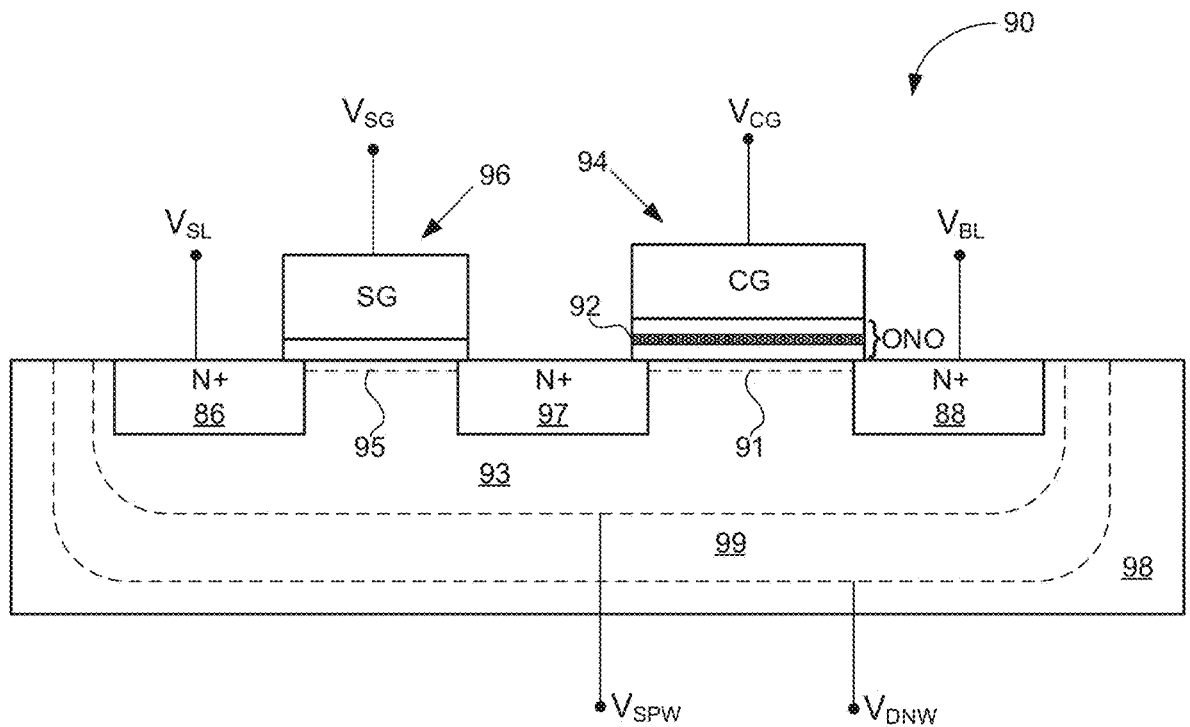
FIG. 1A is a block diagram illustrating a cross-sectional side view of a SONOS based non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cell including SONOS based multi-level NVM transistors and metal-oxide-semiconductor (MOS) transistors or field-effect transistors (FET) and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

SUMMARY OF SUBJECT MATTER

According to one embodiment of a semiconductor device, the semiconductor may include a SONOS based NVM array including charge-trapping memory cells arranged in rows and columns. The memory cells may be configured to store one of N×analog values (N is a natural number greater than 2). In one embodiment, each charge-trapping memory cell may have a memory transistor including an angled lightly doped drain (LDD) implant in its source and drain regions. The angled LDD implant extends at least partly under an oxide-nitride-oxide (ONO) layer of the memory transistor. In one embodiment, the ONO layer disposed within the memory transistor and over an adjacent isolation structure may have the same elevation substantially.

In one embodiment, each of the charge-trapping memory cells may have a select transistor including a shared source region, in which the shared source region may be shared between two adjacent charge-trapping memory cells of the same row of the SONOS based NVM array.

In one embodiment, the N×analog values stored in the charge-trapping memory cell may correspond to the N×drain current ($I_D$) levels and N×threshold voltage ($V_T$) levels of the memory transistor. In one embodiment, the N×$I_D$ levels and N×$V_T$ levels may be pre-determined.

In one embodiment, the N×$I_D$ levels may be linearly incremental and the N×$V_T$ levels may be linearly decremental.

In one embodiment, two adjacent distributions of the N×$I_D$ levels may have an overlapping frequency of less than 3%.

In one embodiment, the angled LDD implant of the memory transistor may have dopant dose in an approximate range of 1e12-1e15 atoms per $cm^2$ of phosphorus so as to minimize gate induced drain leakage (GIDL) current and drain current ($I_D$) and threshold voltage ($V_T$) distribution sigma of the memory transistor.

In one embodiment, the ONO layer of the memory transistor may have a blocking dielectric layer, a charge trapping layer, and a tunnel oxide layer. The blocking dielectric layer may be formed by a first in-situ steam generation (ISSG) process such that interface charge traps between the blocking dielectric and the charge trapping layer are minimized. The tunnel oxide layer may be formed by a second ISSG process such that interface charge traps between the tunnel oxide layer and a substrate, and between the tunnel oxide layer and the charge trapping layer are minimized.

In one embodiment, the charge trapping layer may have an upper charge trapping layer disposed over a lower charge trapping layer. The upper charge trapping layer may be formed by a first chemical vapor deposition (CVD) process using a process gas including DCS/NH$_3$ mixture and N$_2$O/NH$_3$ gas mixture at first flow rates. In one embodiment, the lower charge trapping layer may be formed by a second CVD process using the process gas including DCS/NH$_3$ mixture and N$_2$O/NH$_3$ gas mixture at second flow rates, in which the first flow rate of the N$_2$O/NH$_3$ gas mixture in the first CVD process may be increased while the second flow rate of the DCS/NH$_3$ reduced to minimize a concentration of shallow charge traps in the charge trapping layer.

In one embodiment, the adjacent isolation structure may be a shallow trench isolation (STI) separating two rows or two columns of charge-trapping memory cells. In one embodiment, there may be substantially no divot in an interface area between the memory transistor and the STI. In one embodiment, the tunnel oxide formed by the ISSG process may have a uniform thickness around the STI corner between the STI and the charge-trapping memory cells.

In one embodiment, the one of N×analog values stored in the charge-trapping memory cells may be written by a series of partial program operations and partial erase operations using Fowler-Nordheim tunneling.

According to one embodiment of a semiconductor device, the semiconductor device may have a SONOS based NVM array configured to function as an inference device. The semiconductor device may have multiple multi-level memory cells and each cell may include a memory transistor including an angled lightly doped drain (LDD) implant extends at least partly under an oxide-nitride-oxide (ONO) layer of the memory transistor. In one embodiment, the ONO layer disposed within the memory transistor and over an adjacent isolation structure may have the same elevation substantially. The device may also include a digital-to-analog (DAC) function configured to receive and convert digital signals from external devices. The digital signals converted may cause analog value stored in at least one multi-level memory cell in at least one column to be read. The device may further have a column multiplexor (mux) function configured to perform inferencing operations using the analog value stored in the at least one multi-level memory cell and an analog-to-digital (ADC) function configured to convert analog results of the inferencing operations from the column mux function to digital values.

In one embodiment, multi-level memory cells in the same row may share a SONOS word line, multi-level memory cells in the same column may share a bit line, and multi-level memory cells in two adjacent columns may be coupled to a common source line.

In one embodiment, the multi-level memory cells may be configured to store one of N×analog values, in which N is a natural number greater than 2. The N×analog values may correspond to N×drain current (I$_D$) levels and N×threshold voltage (V$_T$) levels of the memory transistors, respectively.

In one embodiment, the adjacent isolation structure may be a STI separating two rows or two columns of multi-level memory cells and there may be no divot in a contact area between the memory transistor and the STI.

In one embodiment, the angled LDD implant of the memory transistor may have dopant dose in an approximate range of 1e12-1e15 atoms per cm$^2$ of phosphorus.

According to one embodiment of a system, the system may include a plurality of multi-level non-volatile memory (NVM) devices. Each multi-level NVM device may have a SONOS based array including memory cells configured to store one of N×analog values, wherein N is a natural number greater than 2. In one embodiment, each of the memory cells may have a memory transistor including an angled LDD implant extends at least partly under an ONO layer of the memory transistor. A blocking oxide layer and a tunnel oxide layer of the ONO layer may be formed by an in-situ steam generation (ISSG) process to minimize interface charge traps. The system may also include a digital-to-analog (DAC) function configured to receive and convert digital signals from at least one other multi-level NVM device in the system, a column multiplexor (mux) function configured to perform inferencing operations using analog values stored in the memory cells and the digital signals converted, an analog-to-digital (ADC) function configured to convert analog results of the inferencing operations from the column mux function to digital values, and a bus system coupling the plurality of multi-level NVM devices to one another.

In one embodiment, the N×analog values stored in the memory cells may correspond to the N×drain current (I$_D$) levels and N×threshold voltage (V$_T$) levels of the memory transistors.

In one embodiment, the ONO layer disposed within the memory transistor and over an adjacent isolation structure may have the same elevation substantially. The adjacent isolation structure may be a STI separating two rows or columns of memory cells and there may be no divot in a contact area between the memory transistor and the STI.

In one embodiment, each of the plurality of multi-level NVM devices may be configured to perform as an artificial neuron of a deep neural network (DNN) and the inferencing operations include multiply accumulate (MAC) operations.

In one embodiment, the plurality of multi-level non-volatile memory (NVM) devices and the bus system may be disposed in a single semiconductor die or package or substrate. In one embodiment, the system further has a bus system communicatively coupling the plurality of multi-level NVM devices.

DESCRIPTION OF EMBODIMENTS

Figure 1B:
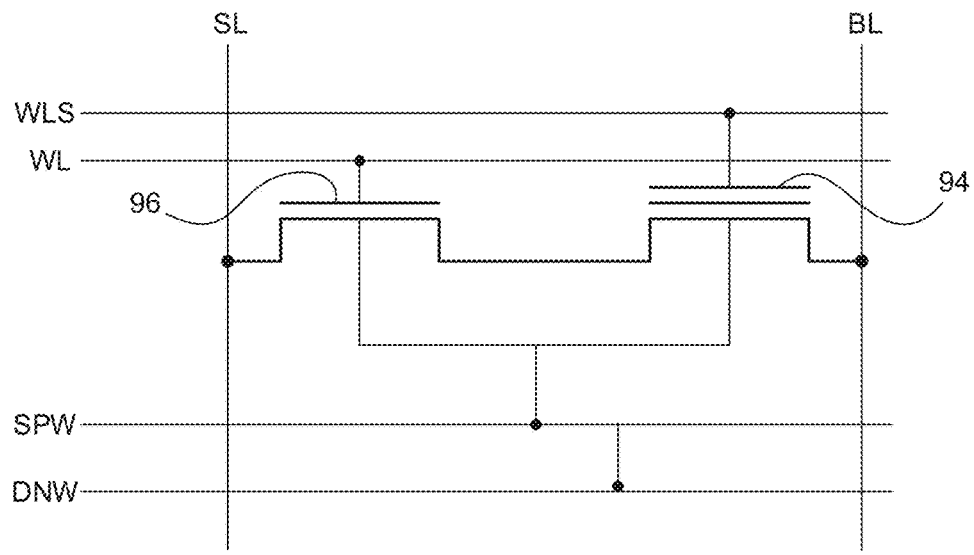
FIG. 1B illustrates a corresponding schematic diagram of the SONOS based non-volatile memory transistor or device depicted in FIG. 1A.

FIG. 1A is a block diagram illustrating a cross-sectional side view of a non-volatile memory cell, and its corresponding schematic diagram is depicted in FIG. 1B. A non-volatile memory (NVM) array or device may include NVM cells with a non-volatile memory transistor or device implemented using Silicon (Semiconductor)-Oxide-Nitride-Oxide-Silicon (Semiconductor) (SONOS) or floating gate technology, and a regular field-effect transistor (FET) disposed adjacent or couple to one another.

In one embodiment, illustrated in FIG. 1A, the non-volatile memory transistor is a SONOS-type charge trapping non-volatile memory transistor that may be configured to store a binary value ("0" or "1") or a multi-level analog value (e.g. 0-2$^n$). Referring to FIG. 1A, NVM cell 90 includes a control gate (CG) or memory gate (MG) stack of NV transistor 94 formed over substrate 98. NVM cell 90 further includes source 97/drain 88 regions formed in substrate 98, or optionally within shallow positive well (SPW) 93 in substrate 98, on either side of NV transistor 94. SPW 93 may be at least partly encapsulated within deep negative well (DNW) 99. In one embodiment, source/drain regions 88 and 97 are connected by channel region 91 underneath NV transistor 94. NV transistor 94 includes an oxide tunnel dielectric layer, a nitride or oxynitride charge-trapping layer 92, an oxide top or blocking layer, forming the ONO stack. In one embodiment, charge-trapping layer 92 may be multiple layered and traps charges injected from substrate 93 by FN tunneling. $V_T$ and $I_D$ values of NV transistor 94 may change at least partly due to the amount of trapped charges. In one embodiment, a high K dielectric layer may form at least a portion of the blocking layer. A poly-silicon (poly) or metal gate layer disposed overlying the ONO layer, which may serve as a control gate (CG) or memory gate (MG). As best shown in FIG. 1A, NVM cell 90 further includes a FET 96 disposed adjacent to NV transistor 94. In one embodiment, FET 96 includes a metal or polysilicon select gate (SG) disposed overlying an oxide or high-K dielectric gate dielectric layer. FET 96 further includes source/drain regions 86 and 97 formed in substrate 98, or optionally within well 93 in substrate 98, on either side of FET 96. As best shown in FIG. 1A, FET 96 and NV transistor 94 share source/drain region 97 disposed in-between, or referred to as internal node 97. SG is appropriately biased by $V_{SG}$ to open or close the channel 95 underneath FET 96. NVM cell 90, as illustrated in FIG. 1A, is considered having a two-transistor (2T) architecture, wherein NV transistor 94 and FET 96 may be considered the memory transistor and the select or pass transistor, respectively throughout this patent document.

In one embodiment, FIG. 1B depicts a two-transistor (2T) SONOS NVM cell 90 with non-volatile (NV) transistor 94 connected in series with FET 96. NVM cell 90 is programmed (bit value "1") when CG is appropriately biased by $V_{CG}$, or by applying a positive pulse on CG with respect to substrate 98 or well 93 that causes electrons to be injected from the inversion layer into charge-trapping layer 92 by FN tunneling. The charge trapped in the charge-trapping layer 92 results in an electron depletion between the drain 88 and the source 97, raising the threshold voltage ($V_T$) necessary to turn on the SONOS based NV transistor 94, putting the device in a "programmed" state. NVM cell 90 is erased by applying an opposite bias $V_{CG}$ on the CG, or a negative pulse on CG, with respect to substrate 98 or well 93 causing FN tunneling of holes from the accumulated channel 91 into the ONO stack. Programmed and erased threshold voltages are called "Vtp" and "Vte" respectively. In one embodiment, NV transistor 94 may also be in an inhibit state (bit value "0") wherein a previously erased cell (bit value "0") is inhibited from being programmed (bit value "1") by applying a positive voltage on the source and drain of NVM cell 90 while control gate (CG) is pulsed positive with respect to substrate 98 or well 93 (as in the program condition). The threshold voltage (referred to as "Vtpi") of NV transistor 94 becomes slightly more positive due to the disturbing vertical field but it remains erased (or inhibited). In one embodiment, Vtpi is also determined by the ability of the charge-trapping layer 92 of the ONO stack to keep the trapped charges (holes for the erased state) in charge-trapping layer 92. If the charge traps are shallow, the trapped charges tend to dissipate and the Vtpi of NV transistor 94 becomes more positive. In one embodiment, Vtpi of NV transistor 94 tends to decay or creep up with further inhibit operations. It will be the understanding that the allocation of bit or binary values "1" and "0" to the respective "programmed" and "erased" states of NVM cell 90 herein is only for explanation purposes, and not to be interpreted as a limitation. The allocation may be reversed or have other arrangements in other embodiments.

In another embodiment, the NV transistor 94 may be a floating-gate MOS field-effect transistor (FGMOS) or device. Generally, FGMOS is similar in structure to the SONOS based NV transistor 94 described above, differing primarily in that a FGMOS includes a poly-silicon (poly) floating gate, which is capacitively coupled to inputs of the device, rather than a nitride or oxynitride charge-trapping layer 92. Thus, the FGMOS device can be described with reference to FIGS. 1A and 1B, and operated in a similar manner.

Similar to the SONOS based NV transistor 94, the FGMOS device may be programmed by applying an appropriate bias $V_{CG}$ between the control gate and the source and drain regions, raising the threshold voltage $V_T$ necessary to turn on the FGMOS device. The FGMOS device can be erased by applying an opposite bias $V_{CG}$ on the control gate.

In one embodiment, source/drain region 86 may be considered as the "source" of NVM cell 90, and coupled to $V_{SL}$, while source/drain region 88 as the "drain", and coupled to $V_{BL}$. Optionally, SPW 93 is coupled with $V_{SPW}$ and DNW 99 with $V_{DNW}$.

FET 96 may prevent hot carrier electron injection and junction breakdown during program or erase operations. FET 96 may also prevent large currents from flowing between source 86 and drain 88, which may cause high energy consumption and parasitic voltage drops in the memory array. As best shown in FIG. 1A, both FET 96 and NV transistor 94 may be n-type or n-channel transistors, wherein source/drain regions 86, 88, 97, and DNW 99 are doped with n-type material while SPW 93 and/or substrate 98 is doped with p-type material. It will be the understanding that NVM cell 90 may also include, additionally or alternatively, p-type or p-channel transistors, wherein the source/drain regions and well may be doped oppositely, or differently according to the practice of ordinary skill in the art.

A memory array is constructed by fabricating a grid of memory cells, such as NVM cells 90, arranged in rows and columns and connected by a number of horizontal and vertical control lines to peripheral circuitry such as address decoders and comparators such as analog-to-digital (ADC) and digital-to-analog (DAC) functions. Each memory cell includes at least one non-volatile semiconductor device, such as those described above, and may have a one-transistor (1T), or two-transistor (2T) architecture as described in FIG. 1A.

Figure 2:
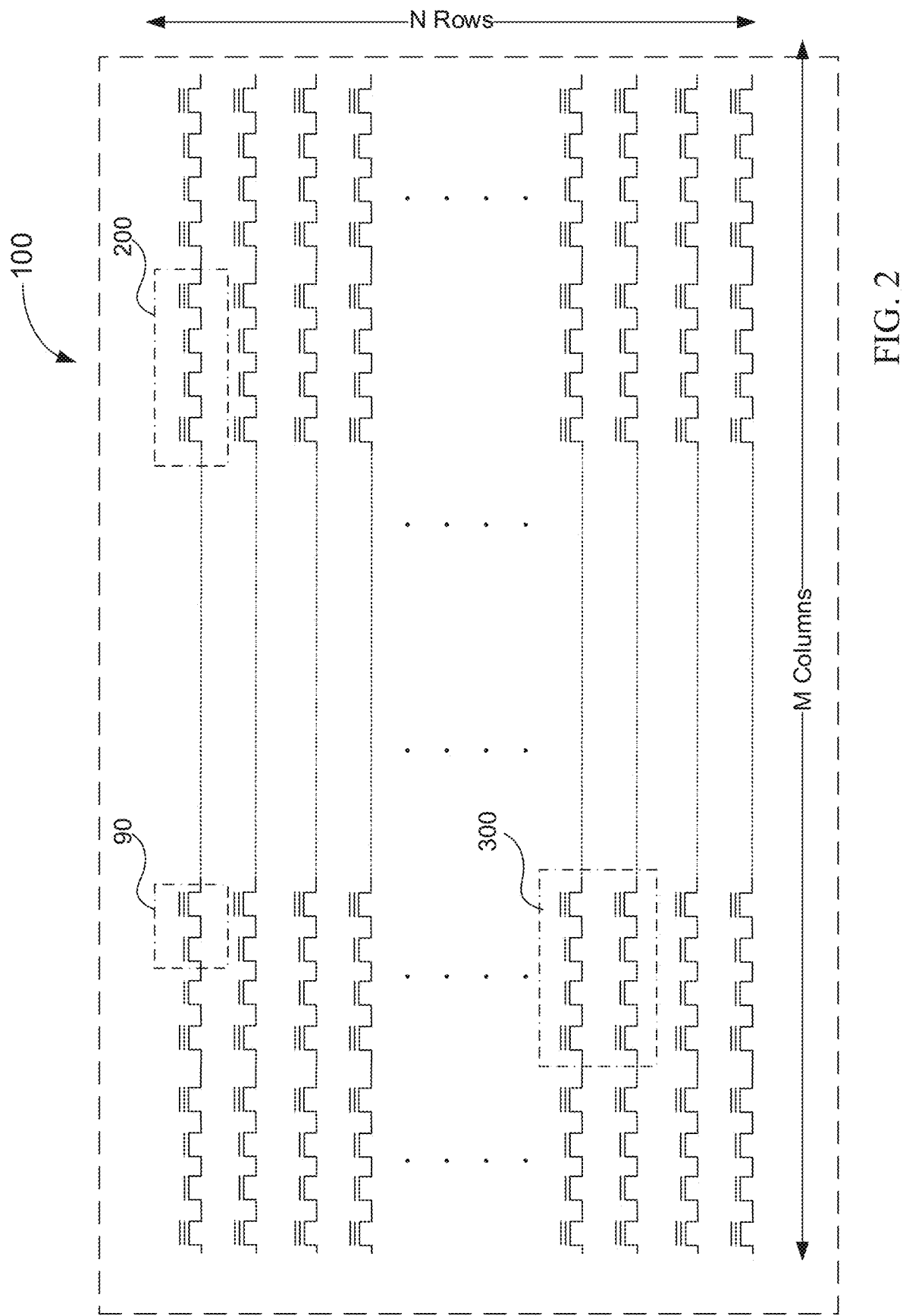
FIG. 2 is a schematic diagram illustrating a SONOS based non-volatile memory array according to one embodiment of the present disclosure.

FIG. 2 is a schematic diagram illustrating an NVM array in accordance with one embodiment of the subject matter. In one embodiment, illustrated in FIG. 2, the memory cell 90 has a 2T architecture and includes, in addition to a non-volatile memory transistor, a pass or select transistor, for example, a conventional MOSFET sharing a common substrate connection, or internal node, with the memory transistor. In one embodiment, NVM array 100 includes NVM cells 90 arranged in N rows or page (horizontal) and M columns (vertical). NVM cells 90 in the same row may be considered to be in the same page. In some embodiments, several rows or pages may be grouped together to form memory sectors. It should be appreciated that the terms "rows" and "columns" of a memory array are used for purposes of illustration, rather than limitation. In one embodiment, rows are arranged horizontally and columns are arranged vertically. In another embodiment, the terms of rows and columns of memory array may be reversed or used in an opposite sense, or arranged in any orientation.

Figure 3A:
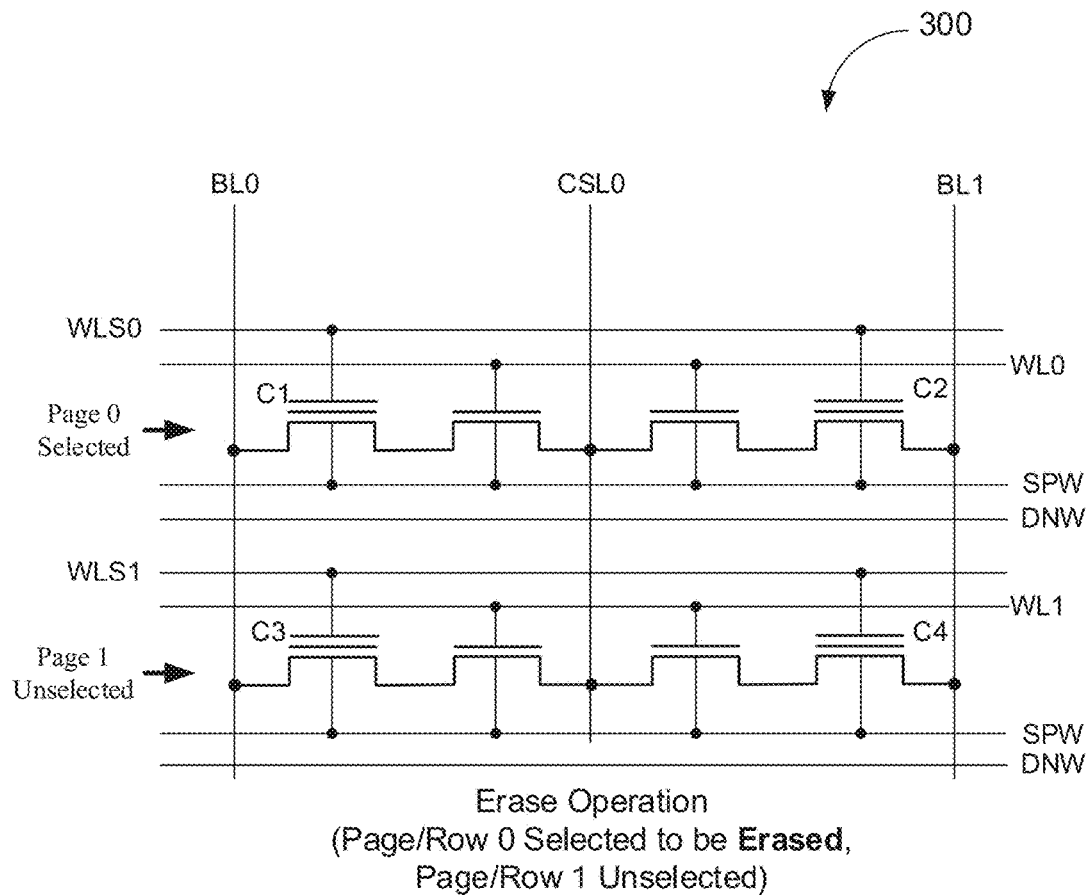
FIG. 3A is a schematic diagram of a segment of a SONOS based non-volatile memory array illustrating an embodiment of an erase operation according to the present disclosure.

In one embodiment, a SONOS word line (WLS) is coupled to all CGs of NVM cells 90 of the same row, a word line (WL) is coupled to all SGs of NVM cells 90 of the same row. A bit lines (BL) are coupled to all drain regions 88 of NVM cells 90 of the same column, while a common source line (CSL) or region 86 is coupled or shared among all NVM cells in the array, in one embodiment. In one alternative embodiment, a CSL may be shared between two paired NVM cells, such as C1 and C2 as best shown in FIG. 3A, of the same row. An CSL also couples to shared source regions of all NVM pairs of the same two columns.

In the flash mode, a write operation may consist of a bulk erase operation on a selected row (page) followed by program or inhibit operations on individual cells in the same row. The smallest block of NVM cells that can be erased at a time is a single page (row). The smallest block of cells that can be programmed/inhibited at a time may also be a single page.

Referring to FIG. 2, NVM cells 90 may be arranged in pairs, such as NVM cell pair 200. In one embodiment, as best shown in FIGS. 3A, 3B, 8A, and 8B, NVM cell pair 200 includes two NVM cells 90 having a mirrored orientation, such that select transistors of each NVM cell, for example C1 and C2, are disposed adjacent to one another. NVM cells 90 of the same NVM cell pair 200 may also share a common source region, receiving the voltage signal $V_{CSL}$.

FIG. 3A illustrates a 2×2 array 300 of NVM array 100 to demonstrate an embodiment of an erase or a hard erase operation according to the present disclosure. As explained earlier, NVM array 100 may adopt a common source-line (CSL) configuration. In one embodiment, one single CSL (e.g. CSL0) is shared among all NVM cells in the NVM array or at least between NVM cells (e.g. C1 and C2) of adjoining columns. In one embodiment, CSLs may be disposed and shared between select transistors of NVM cells 90 of adjacent columns. In the following description, for clarity and ease of explanation, it is assumed that all of the transistors in NVM array 100 including 2×2 array 300 are N-type transistors. It should be appreciated, without loss of generality that a P-type configuration can be described by reversing the polarity of the applied voltages, and that such a configuration is within the contemplated embodiments of the disclosure. In addition, the voltages and pulse durations used in the following description are selected for ease of explanation and represent only one exemplary embodiment of the subject matter. Other voltages may be employed in different embodiments.

FIG. 3A illustrates an exemplary embodiment of a segment of NVM array 100, which may be part of a large memory array of memory cells. In FIG. 3A, 2×2 memory array 300 includes at least four memory cells C1, C2, C3, and C4 arranged in two rows and two columns. While NVM cells C1-C4 may be disposed in two adjacent columns (common source line CSL0), they may be disposed in two adjacent rows, or two non-adjacent rows. Each of the NVM cells C1-C4 may be structurally similar to NVM cell 90 as described above.

Each of NVM cells C1-C4 may include a SONOS based memory transistor and a select transistor. Each of the memory transistors includes a drain coupled to a bit line (e.g. BL0 and BL1), a source coupled to a drain of the select transistor and, through the select transistor, to a single, common source line (e.g. CSL0). Each memory transistor further includes a control gate coupled to a SONOS word line (e.g. WLS0). The select transistors each includes a source coupled to the common source line (e.g. CSL0) and a select gate coupled to a word line (e.g. WL0).

Referring to FIG. 3A, for example, page 0 is selected to be erased and page 1 is not (unselected) for an erase operation. As explained earlier, a single page may be the smallest block of NVM cells 90 that is erased in one operation. Therefore, all NVM cells including C1 and C2 in a selected row (page 0) are erased at once by applying the appropriate voltages to a SONOS word line (WLS0) shared by all NVM cells in the row, the substrate connection and to all bit lines in NVM array 100. In one embodiment, a negative voltage $V_{NEG}$ is applied to WLS0, and a positive voltage $V_{POS}$ is applied to substrate or p-well via SPW and deep n-well DNW of all NVM cells in page 0, all bit lines including BL0 and BL1, and the common source lines including CSL. Therefore, a full erase voltage ($V_{NEG}$–$V_{POS}$) is impressed between CGs and substrate/P-wells of memory transistors in C1 and C2 for a pulse duration (Te~10 ms) to erase any previously trapped charges (if any) therein. In one embodiment, all word lines including WL0 and WL1 are coupled to a supply voltage $V_{PWR}$.

Still referring to FIG. 3A, when a page (row) is not selected for an erase operation, e.g. page 1, a positive voltage $V_{POS}$ is applied to WLS1 instead, such that the CGs to substrate/P-wells of memory transistors in page 1 include C3 and C4 is approximately 0 V ($V_{POS}$–$V_{POS}$). Therefore, the state of NVM cells of page 1 remain unchanged (not erased).

Table I depicts exemplary bias voltages that may be used for a bulk erase operation of page/row 0 of a non-volatile memory having a 2T-architecture and including memory cells with N-type SONOS transistors and CSLs, resembling 2×2 array 300.

TABLE I

| Node | Voltages (V) | Voltage Range (V) |
|------|--------------|-------------------|
| WLS0 | $V_{NEG}$ e.g. −3.8 V | −4.0 V to −3.2 V |
| BL0  | $V_{POS}$ e.g. +4.2 V | +3.8 V to +4.6 V |
| WL0  | $V_{PWR}$ e.g. +1.1 V | +1.0 V to +1.2 V |
| SPW  | $V_{POS}$ e.g. +4.2 V | +3.8 V to +4.6 V |
| DNW  | $V_{POS}$ e.g. +4.2 V | +3.8 V to +4.6 V |
| CLS0 | $V_{POS}$ e.g. +4.2 V | +3.8 V to +4.6 V |
| WLS1 | $V_{POS}$ e.g. +4.2 V | +3.8 V to +4.6 V |
| BL1  | $V_{POS}$ e.g. +4.2 V | +3.8 V to +4.6 V |
| WL1  | $V_{PWR}$ e.g. +1.1 V | +1.0 V to +1.2 V |

Figure 3B:
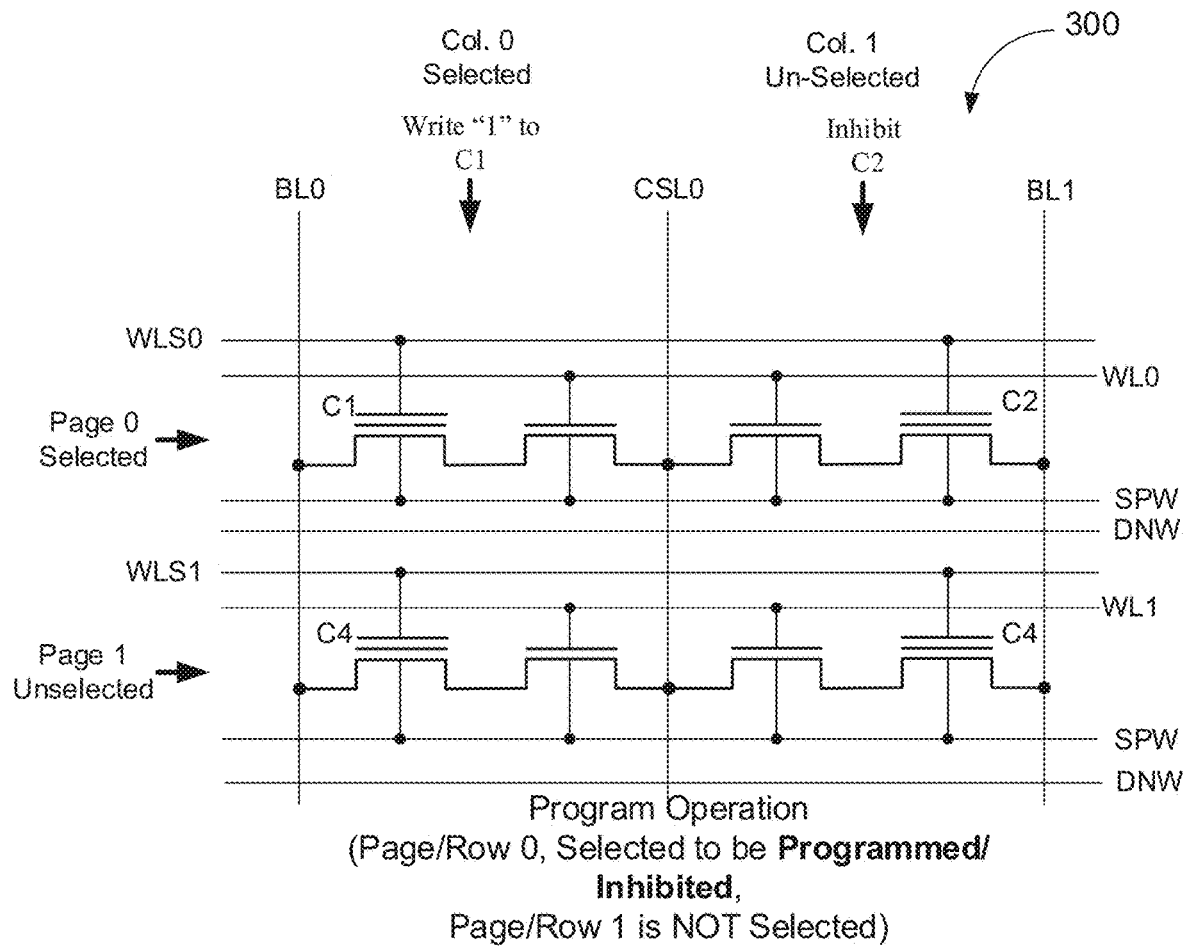
FIG. 3B is a schematic diagram of a segment of a SONOS based non-volatile memory array illustrating an embodiment of a program/inhibit operation according to the present disclosure.

FIG. 3B illustrates an exemplary embodiment of a segment 2×2 array 300 of NVM array 100, during a program operation. Referring to FIG. 3B, for example, NVM cell C1 is the targeted cell to be programmed or written to a logic "1" state (i.e., programmed to an OFF state) while NVM cell C2, already erased to a logic "0" state by a preceding erase operation as depicted in FIG. 3A, is maintained in a logic "0" or ON state. It will be the understanding that C1 and C2, while being illustrated as two adjacent cells for illustrative purposes, may also be two separated NVM cells on the same row, such as row 0. These two objectives (programming C1 and inhibiting C2) are accomplished by applying a first or positive high voltage ($V_{POS}$) to WLS0 in page or row 0 of NVM array 100, a second or negative high voltage ($V_{NEG}$), is applied to BL0 to bias memory transistor of C1 on programming the selected memory cell, while an inhibit voltage ($V_{INHIB}$) is applied to BL1 and DNW to bias memory transistor of C2 on inhibiting programming of the unselected memory cell(s), and a common voltage is applied to the shared substrate or p-well SPW of all NVM cells, and the word lines (WL1 and WL2) coupled to the second or negative high voltage ($V_{NEG}$). In one embodiment, the common source line CSL0 between C1 and C2 or among all NVM cells 90 may be at a third high voltage or CSL voltage ($V_{CSL}$), or allowed to float. In one embodiment, third high voltage $V_{CSL}$ may have a voltage level or absolute magnitude less than $V_{POS}$ or $V_{NEG}$. In one embodiment, $V_{CSL}$ may be generated by its own dedicated circuitry including DAC in the memory device (not shown). $V_{CSL}$ may have an approximately same voltage level or absolute magnitude as margin voltage $V_{MARG}$, which will be discussed in further detail in later sections. When $V_{POS}$ via WLS0 is applied to the memory transistor of C2, the positive $V_{INHIB}$ on BL1 is transferred to its channel. This voltage reduces the gate-to-drain/channel voltage on the memory transistor of C2, reducing the programming field so that the shift in threshold voltage from Vte is small. The tunneling of charges that may still occur is known as the inhibit disturb, and is quantified as (Vte−Vtpi). In one embodiment, as a result of the program operation, all NVM cells of page 0 including C1 and C2, may attain a binary state of "1" (programmed—Vtp) or "0" (inhibited—Vtpi) based on the bit line voltage the NVM cell receives. NVM cells in unselected pages, such as page 1, may remain the binary state of "0" (erased—Vte).

In addition, and as described in greater detail below, a selected margin voltage ($V_{MARG}$) having a voltage level or absolute magnitude less than $V_{NEG}$ is applied to WLS1 in an unselected row or page (e.g. page 1) to reduce or substantially eliminate program-state bit line disturb in the unselected NVM cell C4 due to programming of the selected C1. In one embodiment, the absolute voltage level or magnitude of $V_{MARG}$ may be the same as $V_{CSL}$.

Table II depicts exemplary bias voltages that may be used for programming a non-volatile memory having a 2T-architecture and including memory cells with N-type SONOS transistors and CSLs.

TABLE II

| Node | Voltages (V) | Voltage Range (V) |
|---|---|---|
| WLS0 | $V_{POS}$ e.g. +4.2 V | +3.8 V to +4.6 V |
| BL0 | $V_{NEG}$ e.g. −3.8 V | −4.0 V to −3.4 V |
| WL0 | $V_{NEG}$ e.g. −3.8 V | −4.0 V to −3.4 V |
| SPW | $V_{NEG}$ e.g. −3.8 V | −4.0 V to −3.4 V |
| DNW | $V_{INHIB}$ e.g. +1.1 V | +1.0 V to +1.2 V |
| CLS0 | Float/$V_{MARG}$ e.g. −2.4 V | −3.0 V to −2.0 V |
| WLS1 | $V_{MARG}$ e.g. −2.4 V | −3.0 V to −2.0 V |
| BL1 | $V_{INHIB}$ e.g. +1.1 V | +1.0 V to +1.2 V |
| WL1 | $V_{NEG}$ e.g. −3.8 V | −4.0 V to −3.4 V |

Generally, the margin voltage ($V_{MARG}$) has the same polarity as the second high voltage or $V_{NEG}$, but is higher or more positive than $V_{NEG}$ by a voltage equal to at least the threshold voltage ($V_T$) of the memory transistors for which program state bit line disturb is reduced.

Figure 4:
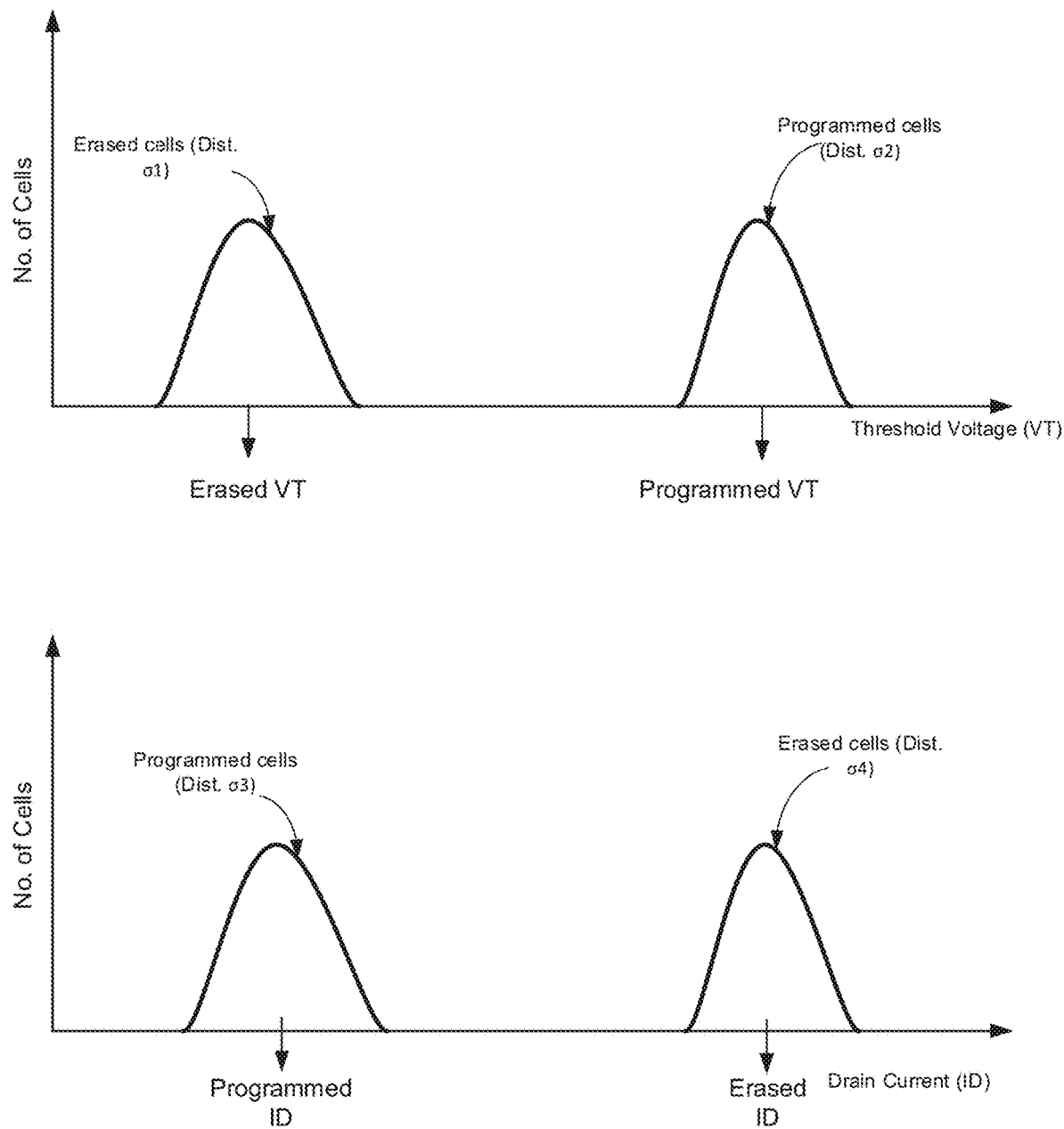
FIG. 4 are representative graphs illustrating distribution of threshold voltages and drain current of fully programmed (Vtp or Idp) and erased (Vte or Ide) of memory transistors in a SONOS based non-volatile memory array according to an embodiment of the present disclosure.

FIG. 4 shows the Vtp & Vte, and drain current programmed ($I_{DP}$) and drain current erased ($I_{DE}$) distributions in an exemplary SONOS based NVM array, such as NVM array 100. A typical write operation includes an erase or a hard erase operation as described in FIG. 3A and followed by a hard program/inhibit operation as described in FIG. 3B. In one embodiment, after a reliable read operation, NVM cell may be determined to be in one of the two distinctive binary states ("0" or "1"). The erase operation as described in FIG. 3A may also be considered a hard erase because it causes to move the $V_T/I_D$ of the erased NVM cells (e.g. C1 and C2 in FIG. 3A) to the Erased $V_T/I_D$ levels (a complete erase), regardless of the starting $V_T/I_D$ levels of those cells. Similarly, the program operation as described in FIG. 3B may be considered a hard program operation. In one embodiment, there is no verification or read operation between the hard erase and hard program/inhibit operations.

Figure 5:
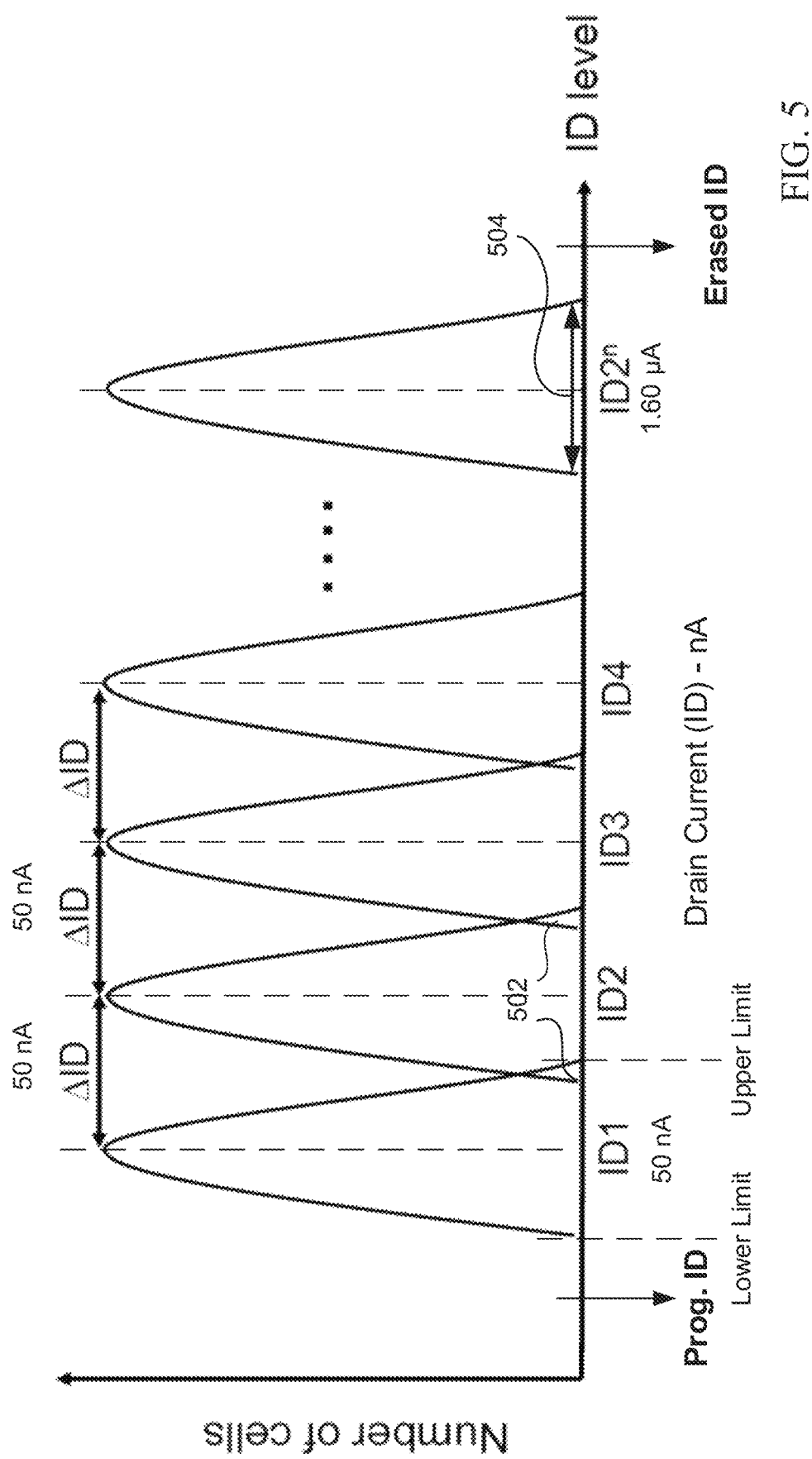
FIG. 5 is a representative graph illustrating distributions of drain current ($I_D$) level in a multi-level SONOS based non-volatile memory cell according to an embodiment of the present disclosure.

FIG. 5 is a schematic showing multiple drain current ($I_D$) levels of multi-level NVM memory cells in a SONOS based NVM analog device in accordance with one embodiment of the subject matter described herein. In one embodiment, $I_D$ of a multi-level NVM cell may be determined or verified by applying a predetermined voltage to CG of SONOS transistor via WLSs, and read via BLs. In other embodiments, $I_D$ may be determined by other methods known and practiced in the art. Similar to $V_T$, $I_D$ may be used to determine the binary state of NVM cells 90 in embodiments that NVM array 100 is utilized as a digital memory device, such as NOR Flash, EEPROM, etc. In other embodiments, NVM array 100 may be utilized in analog devices by storing multiple (more than two) analog values. Referring to FIGS. 4 and 5, instead of writing one of the two binary values ("0" and "1") to NVM cells 90 of NVM array 100 using hard program and erase operations as described in FIGS. 3A and 3B, NVM cells 90 may be written to multiple (more than two) $I_D$ or $V_T$ levels (corresponding to trapped charges in charge trapping layer 92) using a series of partial program and partial erase operations. In embodiments, by manipulating voltage difference or bias and polarity impressed upon the CG and drain or substrate, and pulse duration, partial program and erase operations may cause $V_T/I_D$ of target NVM cells to move towards (or a nudge) the Programmed $V_T/I_D$ and the Erased $V_T/I_D$ levels, respectively. Partial program and erase operations may include but not limited to soft program, refill program, soft erase (row), selective soft erase (cell(s)), and anneal erase (row) operations, which will be further explained in later sections of this patent document.

In one embodiment, as best shown in FIG. 5, in an analog configuration/mode, NVM cells 90 may be configured to represent or store one of the $2^n$ (4, 8, 16, . . . , 128, etc.) values, wherein n is a natural number greater than 1, according to its $I_D$ level. In another embodiment, NVM cells 90 may be configured to represent any number of values that is greater than two. In one embodiment, $I_D 1$ to $I_D 2^n$ are the mean $I_D$ values of the $1^{st}$ to $2^{nth}$ $I_D$ distributions, respectively. In each $I_D$ distribution, there may be a lower $I_D$ limit and an upper $I_D$ limit (see $I_D 1$) defining a target $I_D$ range. In embodiments, mean $I_D$ or mean $V_T$ levels and their upper and lower limits may be predetermined according to system design and requirements. $1^{st}$ $I_D$ distribution may approximate the programmed cells distribution σ3 and $2^{nth}$ $I_D$ distribution the erased cells distribution σ4 in FIG. 4. In one embodiment, an operational $I_D$ range of NVM array 100 may be approximately ($I_D 2^n − I_D 1$), and as an example (1.28 pA-10 nA=1,270 nA). It will be the understanding that the operational $I_D$ range of 1,270 nA is merely an example and could be any other value depending on the NVM cells, operating voltages and pulse durations, and system requirements/design. In one embodiment, by defining multiple $I_D$ or $V_T$ levels and writing NVM cells 90 to a particular target $I_D$ level within the operational $I_D$ range, e.g. 1.28 μA to 10 nA, NVM array 100 may be utilized as an analog memory device to store analog values. In one embodiment, one having ordinary skill in the art would understand that the same concept may apply to writing multiple (more than two) $V_T$ levels to NVM cells 90.

In one embodiment, to achieve multiple distinct $I_D$ levels within a finite operational $I_D$ range, each $I_D$ distribution may be required to have a tight distribution (low sigma a) such that adjacent $I_D$ distributions are clearly separated to minimize false read, especially when n is a high number. $I_D$ mean of different defined levels may also be linearly incremental, such that $\Delta I_D$ is substantially a constant in FIG. 5, for accurate and efficient read/verification operations. SONOS based cells, such as NVM cells 90, are a good candidate for analog memory with multiple levels due to its intrinsically low $I_D/V_T$ sigma and low power consumption ($V_{CC}$=0.81 V-1.21 V). Additionally, since both program and erase operations (both hard and soft) in SONOS based cells are done using FN tunneling, tuning of very fine $I_D/V_T$ levels with very low sigma may be achievable. Moreover, SONOS based cells may have high robust endurance performance with minimal degradation after 100K cycles from −40° C. to 125° C. temperature range, which may meet most of consumer, industrial, and automotive application needs. In one embodiment, there may be overlapping $I_D$ values 502 between adjacent $I_D$ distributions. To have a reliable and accurate read of the $I_D$ level of NVM cells 90, $I_D$ distribution sigma a may be reduced to approximately below 8 nA such that the overlapping area 502 is kept below 1%-3% of the distributions.

Figure 6A:
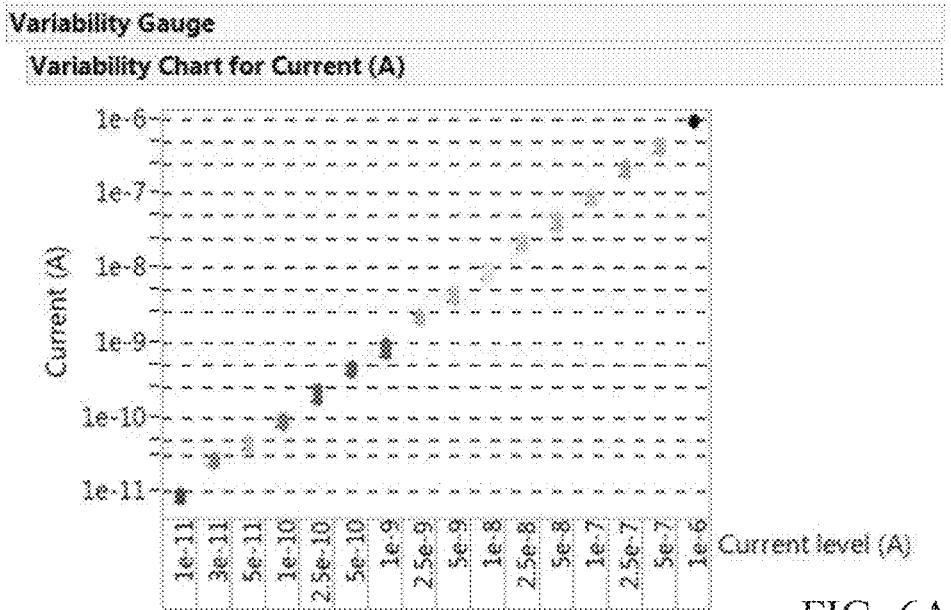
FIG. 6A is a graph illustrating distinct $I_D$ levels of a SONOS based memory transistor in a non-volatile memory array according to an embodiment of the present disclosure.

FIG. 6A is a graph illustrating 16 ($2^4$) $I_D$ levels of an NVM cell in accordance with one embodiment the present disclosure. As best shown in FIG. 5, $I_D$ levels are distinct, well separated (low sigma) and linearly incremental in order to maintain high functionality of multi-level NVM cells as an analog device.

Figure 6B:
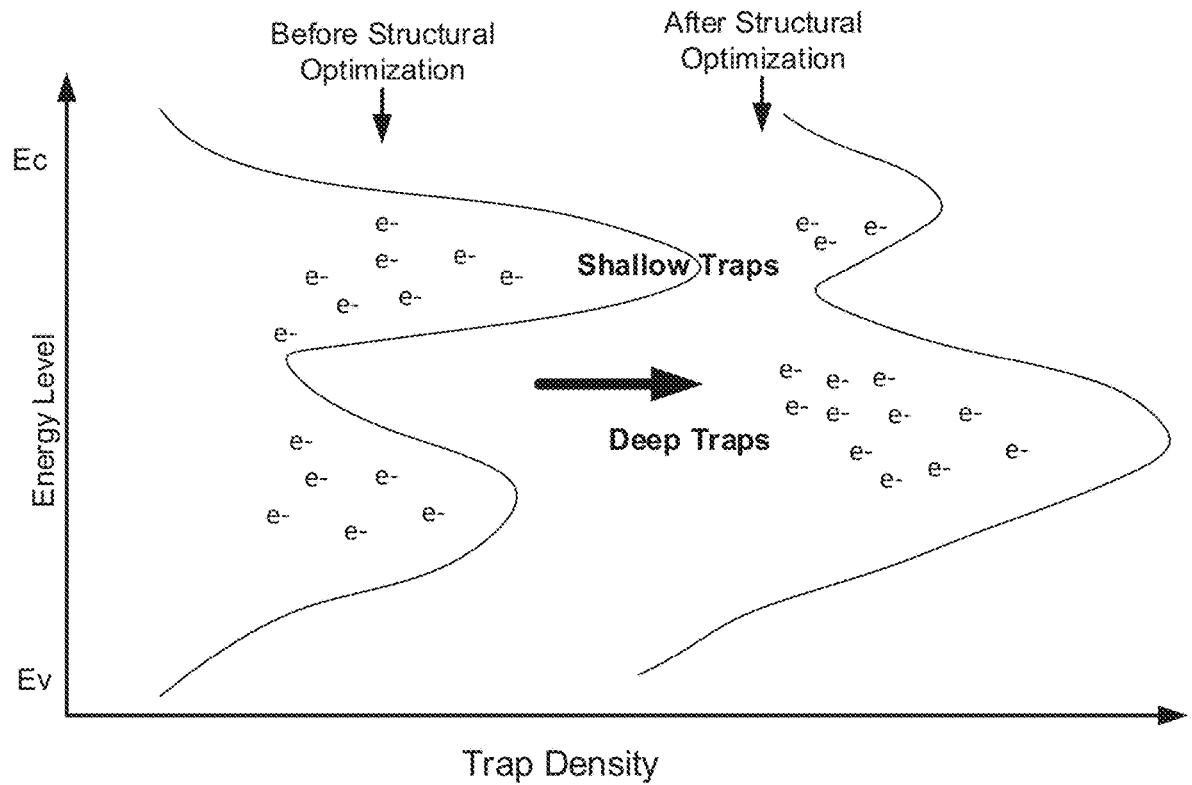
FIG. 6B is a graph illustrating distribution of trapped charges in the charge trapping layer of a SONOS based memory transistor in a non-volatile memory array according to an embodiment of the present disclosure.

FIG. 6B is a schematic diagram illustrating trap density distribution from valence band to conduction band in the charge trapping nitride layer of a SONOS transistor in accordance to the present subject matter. As best shown in FIG. 6B, shallow traps are charge traps that have energy levels that are close to the conduction band (Ec) level while deep traps are charge traps that have energy levels that are in the middle range between the valence band (Ev) and Ec. In one embodiment, charges in shallow traps may account for charge loss during retention primarily as they are more ready to leave the charge trapping nitride layer.

Figure 7:
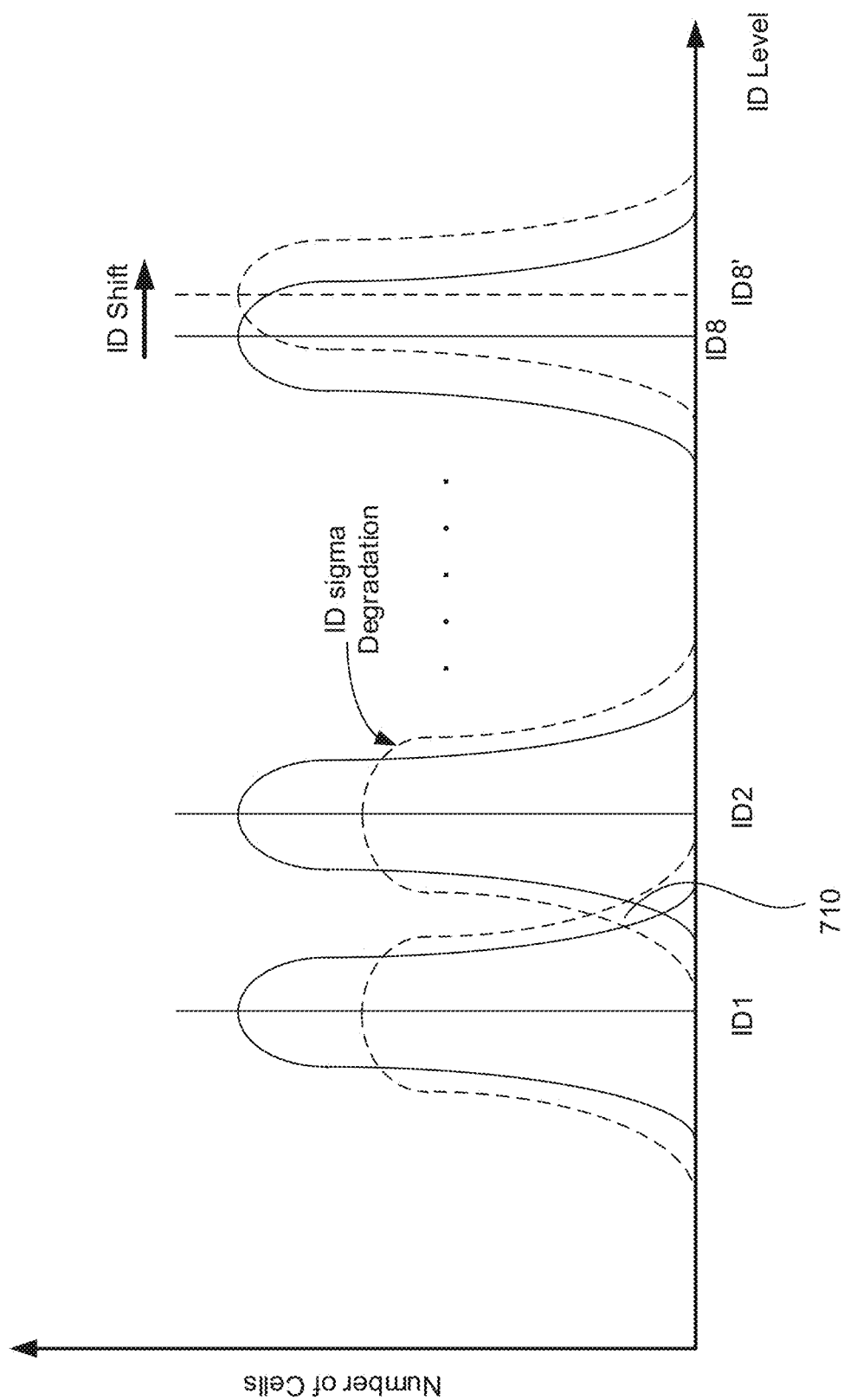
FIG. 7 a graph illustrating $I_D$ distributions of a SONOS based memory transistor in a non-volatile memory array showing $I_D$ sigma and retention degradation according to an embodiment of the present disclosure.

FIG. 7 is a graph illustrating potential effects on $I_D$ distributions in multi-level NVM cells due to $I_D$ and retention degradation. While the Beginning-of-Life (BOL) sigma of SONOS transistors 94 may be very low, there may be severe degradation during retention over time, especially at high temperatures. As a result, $I_D$ distributions (e.g. $I_D1$ and $I_D2$) may be more widely distributed (increased sigma) and adjacent $I_D$ distributions may have more overlapping portion or frequency 710 in FIG. 7 (e.g. more than 3%) that may lead to incorrect/false read of levels or values. In one embodiment, the sigma degradation may be due to the trapped charges in "shallow" traps in the nitride layer 92 being lost during retention while the trapped charge in "deep" traps remains trapped. The trapped charges loss during retention may also cause $I_D$ level to shift upwardly, such as $I_D8$ and $I_D8'$ in FIG. 7.

It is therefore imperative to adopt structural changes or optimization in SONOS based NVM transistors, such as NVM transistor 94, for improved reliability and functionality as multi-level NVM cells. In one embodiment, the structural optimization may decrease the density of shallow traps and/or increase the density of deep traps, as best shown in FIG. 6B. Retention and $I_D/V_T$ sigma degradation may also be improved by fabrication process changes such that the density of shallow traps in the charge trapping layer is reduced and FN tunneling during program and erase operations enhanced. In one embodiment, fabrication process improvements may include smoothing of shallow trench isolation (STI) corner curvature in SONOS transistors, dopant profile optimization in channels, improved oxide layers, which will be illustrated and depicted in later sections.

Figure 8:
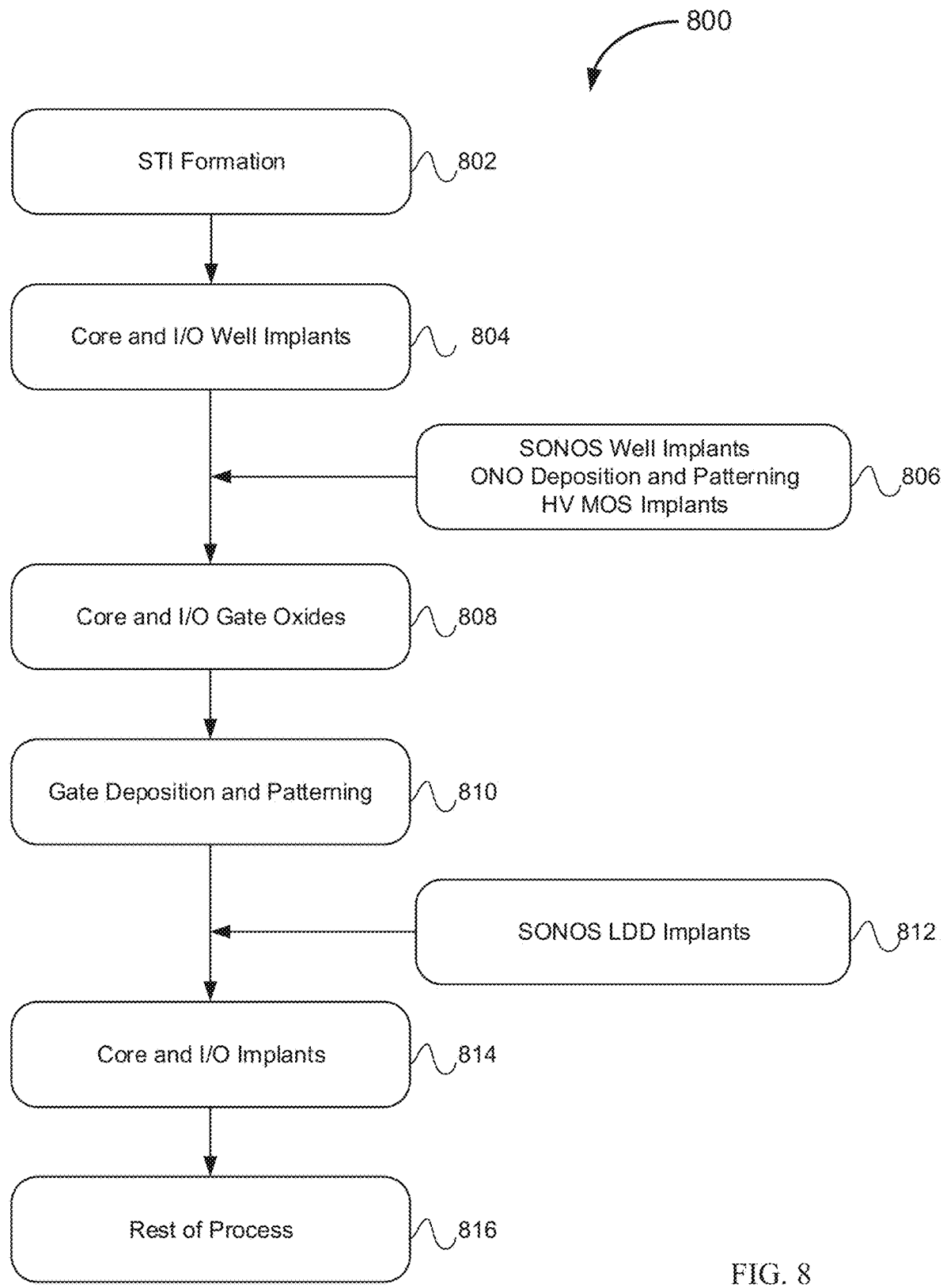
FIG. 8 is a flowchart illustrating an embodiment of a method of fabrication for SONOS based multi-level NVM transistor integration into MOS transistors according to an embodiment of the present disclosure.
Figure 9A:
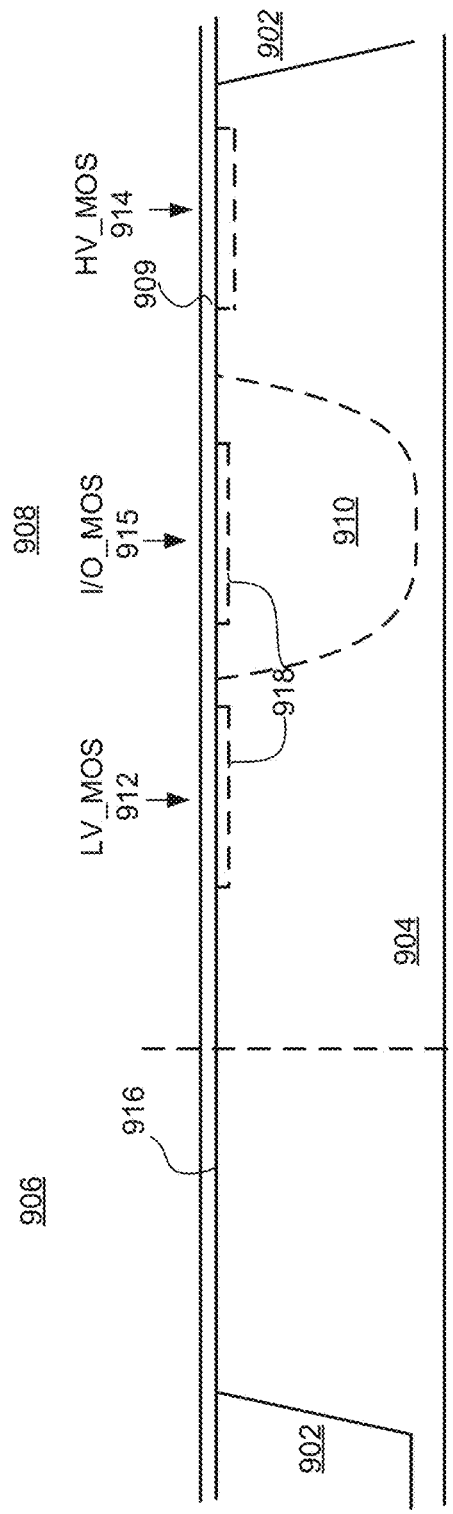
FIGS. 9A-9G are representative diagrams illustrating cross-sectional views of a portion of a memory cell during fabrication of the multi-level memory cell according to the method of FIG. 8.
Figure 10A:
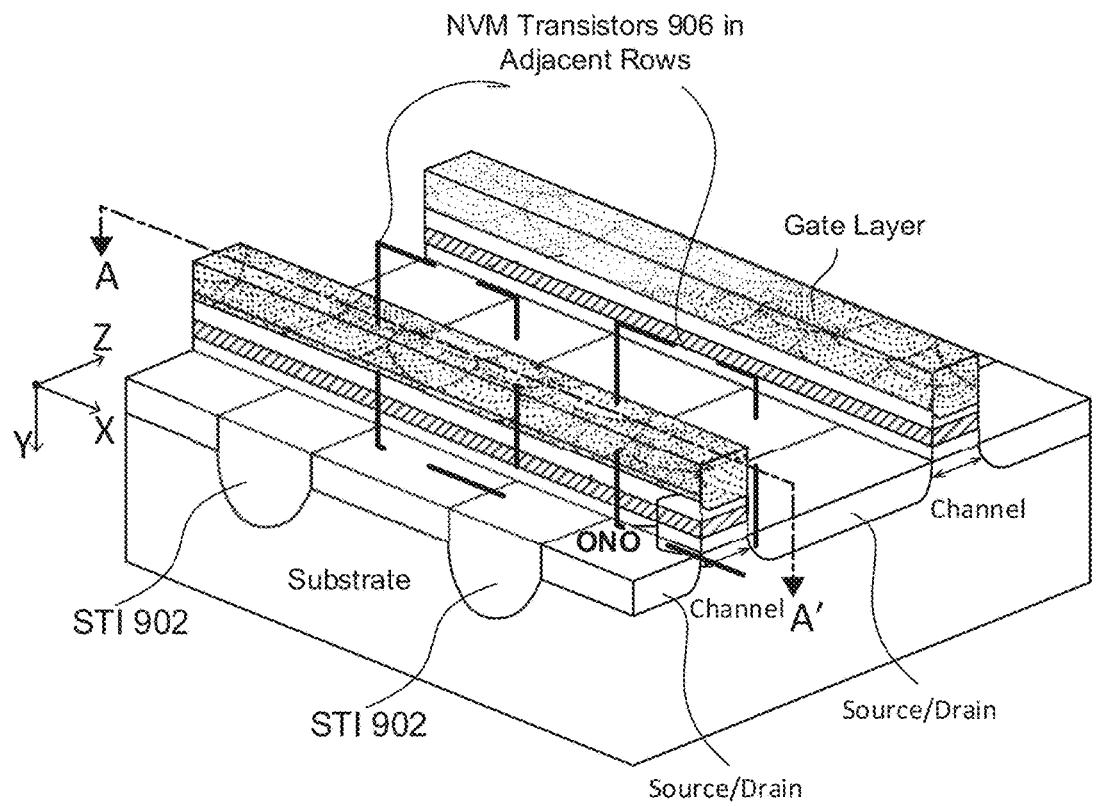
FIG. 10A is a representative isometric view of rows or columns of SONOS based multi-level NVM transistors according to an embodiment of the present disclosure.

FIG. 8 is a process flowchart illustrating key fabrication steps of integrating multi-level SONOS or NVM transistors into a baseline complementary metal oxide semiconductor (CMOS) process flow in accordance with one embodiment of the present disclosure. Referring to FIG. 8 and FIG. 9A, the process begins with forming a number of isolation structures or shallow trench isolation (STI) 902 in a wafer or substrate 904 (step 802). The isolation structures 902 isolate memory cells formed in adjoining areas, array rows, or columns of the substrate 904. For example, as best shown in FIG. 10A, STIs 902 are formed to isolate adjacent rows or columns of multi-level SONOS transistors. Optionally and additionally, isolation structures 902 may be incorporated to isolate the multi-level NVM transistors being formed in a first region 906 of the substrate 904 from one or more of the MOS transistors including HV MOS, I/O MOS, and LV MOS, being formed in a second region 908. In one embodiment, LV MOS (select transistors) may also be formed in the first region 906 to configure the 2T NVM memory cells, such as NVM cells 200 in FIG. 2.

In one embodiment, the isolation structures 902 may include a dielectric material, such as oxide or nitride, and may be formed by any conventional technique, including but not limited to STI or local oxidation of silicon (LOCOS). The substrate 904 may be a bulk substrate composed of any single crystal material suitable for semiconductor device fabrication, or may include a top epitaxial layer of a suitable material formed on a substrate. In one embodiment, suitable materials for the substrate 904 include, but are not limited to, silicon, germanium, silicon-germanium or a Group III-V compound semiconductor material.

As best shown in FIG. 9A, pad oxide 909 may be formed over a surface 916 of the substrate 904 in both the first region 906 and the second region 908. In one embodiment, pad oxide 909 may be silicon dioxide ($SiO_2$) having a thickness of from about 10 nanometers (nm) to about 20 nm and may be grown by a thermal oxidation process or in-situ steam generation (ISSG) process, or other oxidation or deposition processes known in the art. It will be the understanding that pad oxide 909 may not be necessary, or formed in some embodiments.

Figure 9B:
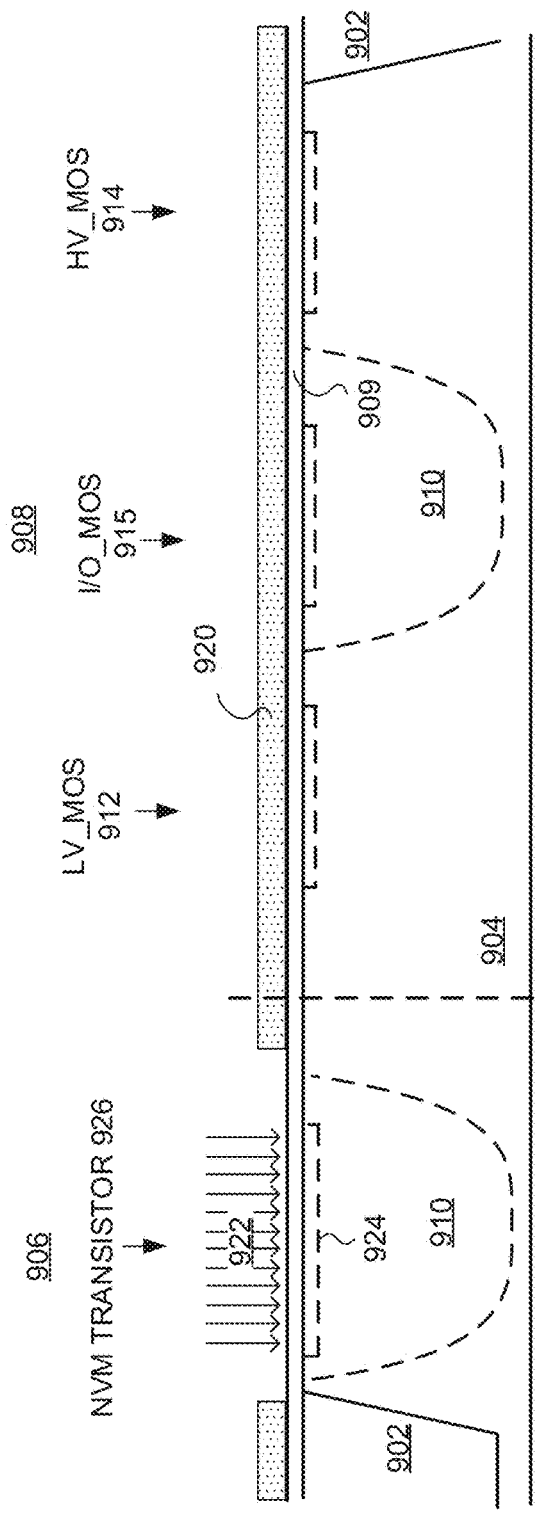

Referring to FIG. 8 and FIG. 9B, dopants are then implanted into substrate 904 through pad oxide 909 (if present) to form wells 910 in which the NVM transistor(s) and/or the MOS transistors may be formed, and channels for the MOS transistors (step 804). According to system design, there may or may not be isolation structures 902 disposed between the first region 906 and the second region 908. The dopants implanted may be of any type and concentration, and may be implanted at any energy, including energies necessary to form wells, such as SPW 93 and/or deep wells, such as DNW 99 for the NVM transistors and/or the MOS transistors, and to form channels for the MOS transistors. In one particular embodiment, illustrated in FIG. 9B as an example, dopants of an appropriate ion species are implanted to form well(s) 910 in the second region 908 over or in which input/output (I/O) MOS transistor 915 may be formed. In alternative embodiments, wells or deep wells may also be formed for the NVM transistor 926 and/or high-voltage (HV) MOS transistor 914, and/or low-voltage (LV) MOS transistor 912. It is further appreciated that the wells, such as well 910, may be formed by depositing and patterning a mask layer, such as a photoresist layer above surface 916 of substrate 904, and implanting an appropriate ion species at an appropriate energy to an appropriate concentration.

In one embodiment, channels 918 for one or more of the HV, I/O, and LV MOS transistors 914, 915, 912 may be formed in substrate 904. It will be the understanding that channels 918 of HV, I/O, and LV MOS transistors 914, 915, 912 may or may not be formed concurrently. As with the well implant, channels 918 may be formed by depositing and patterning a mask layer, such as a photoresist layer above the surface 916 of substrate 904, and implanting an appropriate ion species at an appropriate energy to an appropriate concentration. In one embodiment, for example, $BF_2$ may be implanted at an energy of from about 10 kilo-electron volts (keV), to about 100 keV, and a dose of from about 1e12 $cm^{-2}$ to about 1e14 $cm^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 918, in all three of the MOS transistors 914, 912, 915 at the same time, or at separate times using standard lithographic techniques, including a patterned photoresist layer to mask one of the channels 918 for the MOS transistors 914, 912, 915.

Next, referring to FIG. 8 and FIG. 9B, a patterned tunnel mask 920 is formed on or overlying pad oxide 909 layer, ions (represented by arrows 922) of an appropriate type, energy, and concentration are implanted through a window or opening in tunnel mask 920 to form channel 924 for multi-level NVM transistor 926 in the first region 906, and tunnel mask 920 and pad oxide 909 layer in at least the second region 908 are removed (step 804). Tunnel mask 920 may include a photoresist layer, or a hard mask formed, from a patterned nitride or silicon-nitride layer.

In one embodiment, channel 924 for multi-level NVM transistor 926 may be a deep indium doped channel implanted with indium (In) at an energy of from about 50 kilo-electron volts (keV) to about 500 keV, and a dose of from about 5e11 $cm^{-2}$ to about 1e13 $cm^{-2}$ to form an n-channel multi-level NVM transistor 926. In one embodiment, implanting indium to form channel 924 of multi-level NVM transistor 926 improves the threshold voltage ($V_T$) uniformity of the finished NVM transistor from a sigma of $V_T$ from about 150 millivolts (mV) to about 100 mV. Optionally or additionally, a shallow doped channel is implanted with arsenic at an energy about 20 keV and a dose of from about 5e11 $cm^{-2}$ to about 1e13 $cm^{-2}$ at channel 924. Alternatively, $BF_2$ may be implanted to form an n-channel NVM transistor, or arsenic or phosphorous implanted to form a p-channel NVM transistor. In one alternative embodiment, channel 924 for multi-level NVM transistor 926 may also be formed concurrently with channels 918 of the MOS transistors 914, 912, 915. In embodiments, the particular channel doping configurations may reduce random dopant fluctuation (RDF) such that both $V_T$ and $I_D$ sigma of multiple levels of $V_T$ and $I_D$ distributions are distinct and separated in the finished multi-level NVM transistors 926, as best shown in FIG. 6A.

Figure 9C:
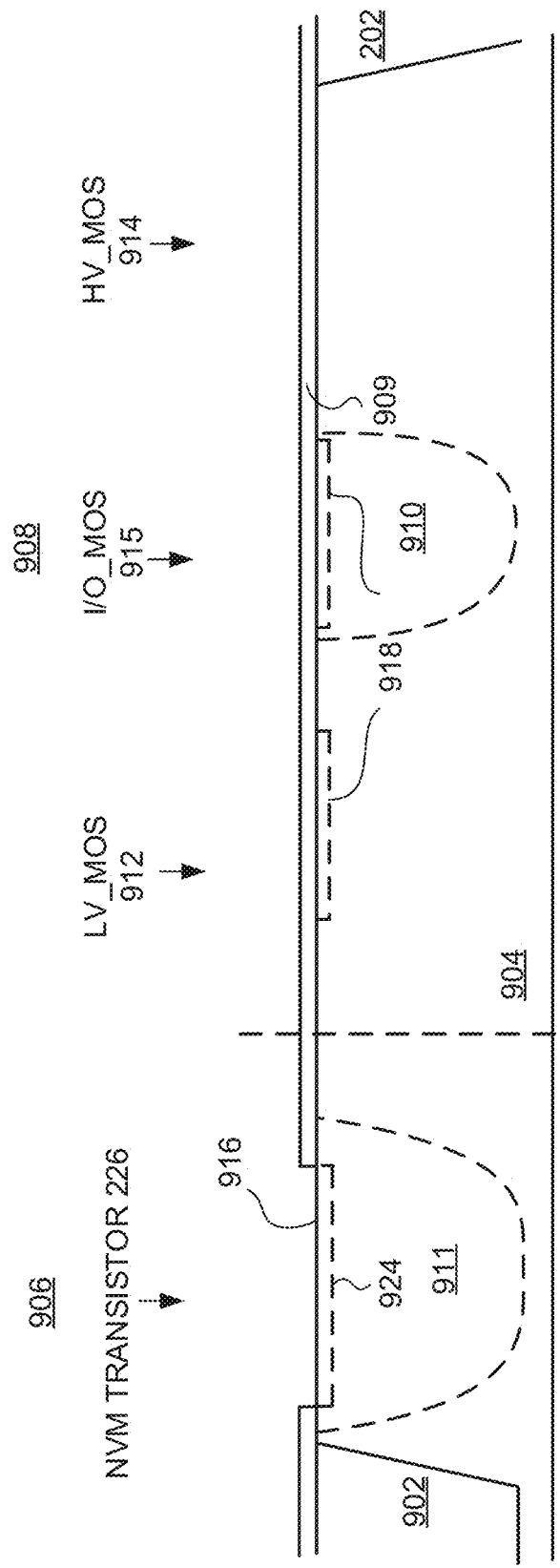
Figure 10B:
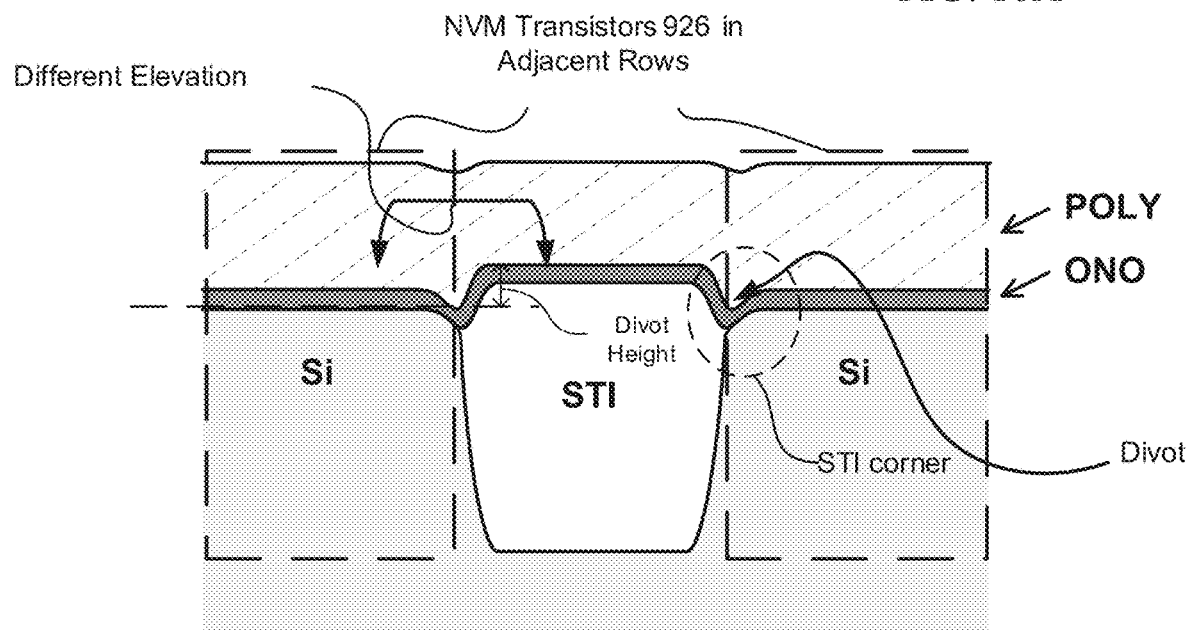
FIGS. 10B, 10C and OD are representative diagrams illustrating cross-sectional views of a portion of a memory cell during fabrication of the multi-level memory cell according to the method of FIG. 8.

In one embodiment, as illustrated in FIG. 9C, pad oxide 909 in the window or opening in the tunnel mask 920 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. In some embodiments, as best shown in FIG. 10A, pad oxide 909 over STIs 902 isolating rows (direction Z) of finished multi-level NVM transistors. FIGS. 10A and 10B are representative diagrams illustrating cross-sectional views along plane A-A'

Subsequently or concurrently, tunnel mask 920 includes photoresist material may be ashed or stripped using oxygen plasma. Alternatively, hard tunnel mask 920 may be removed using a wet or dry etch process known in the art.

Figure 9D:
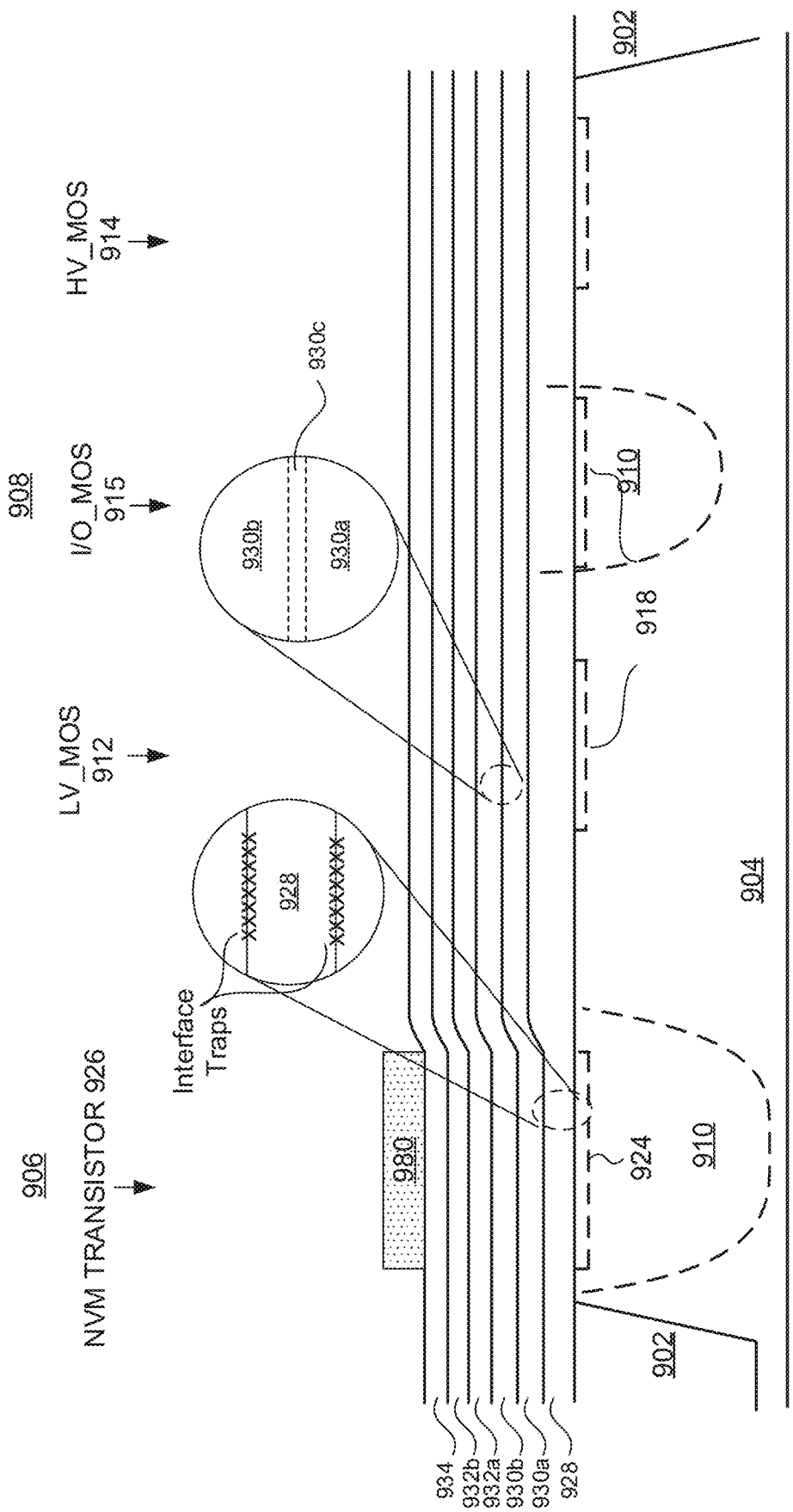
Figure 9E:
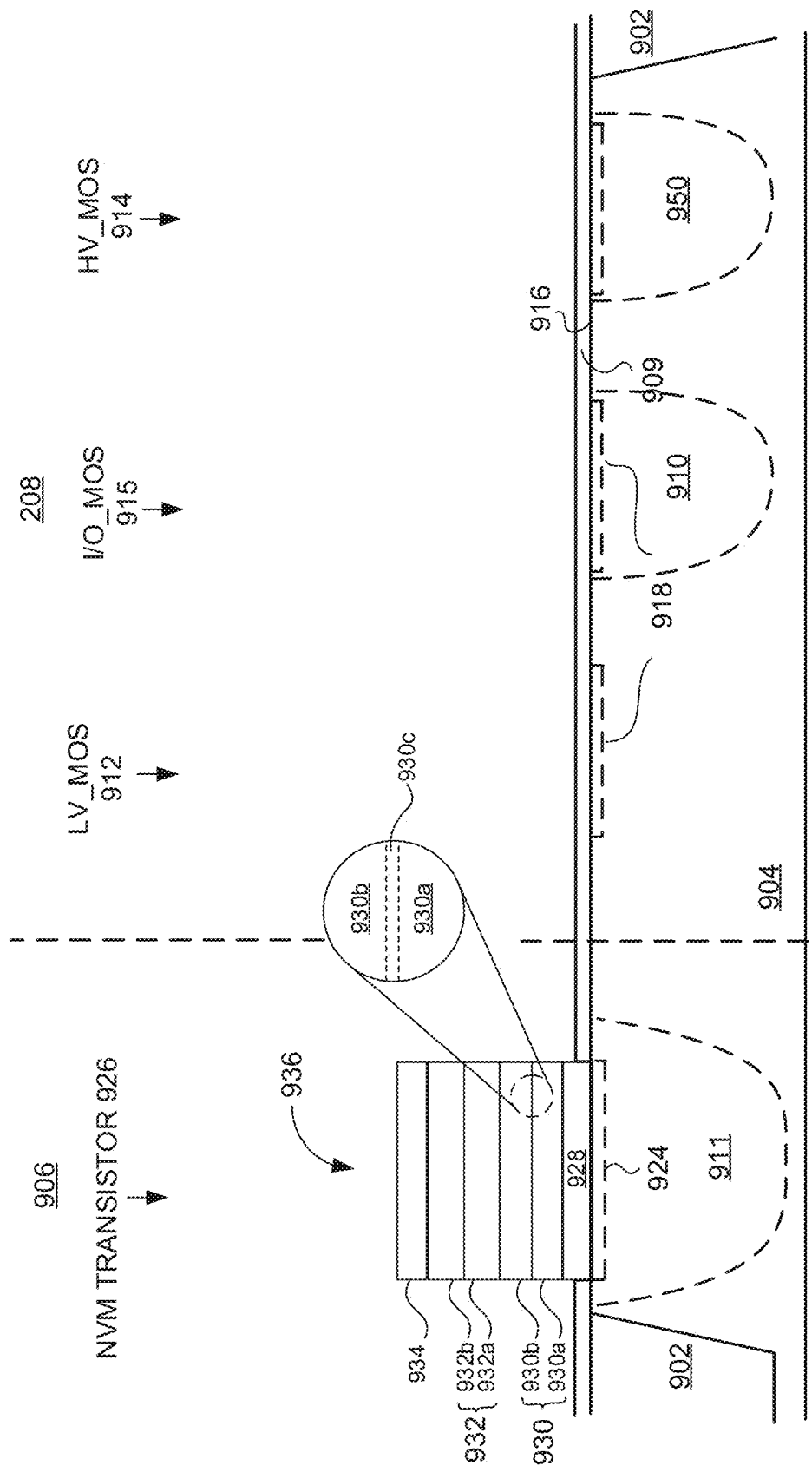

Referring to FIG. 8 and FIGS. 9D to 9E, surface 916 of substrate 904 in the first region 906 is cleaned or pre-cleaned, a number of dielectric layers, such as oxide-nitride-oxide or ONO layers or oxide-nitride-oxide-nitride-oxide or ONONO layers, formed or deposited (step 806). Subsequently, a mask is formed on or overlying the dielectric layers, and the dielectric layers are etched to form NV gate stack 936 in first region 906 (step 806).

The preclean may be a wet or dry process. In one embodiment, it may be a wet process using HF followed by standard cleans (SC1) and (SC2), and is highly selective to the material of substrate 904. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

In one embodiment, the aforementioned clean and preclean process(s) may remove pad oxide 909 over surfaces of substrate 904 and oxide in STIs 902 in differing degrees, thereby giving rise to difference in the heights of their top surfaces. Referring to FIG. 10B, the clean process(s) may create a divot, at the junction where STI 902 is in contact with multi-level NVM transistor 926, due to a difference in elevation (divot height) of their respective top surfaces. Divots in the contact corner like the one shown in FIG. 10B may impact FN tunneling of multi-level NVM transistor 926 and consequently affect $I_D$ and $V_T$ sigma adversely. In one embodiment, clean and preclean processes may be carefully calibrated as per previous description such that top surfaces of ONO layer over STI 902 and substrate 904 are substantially leveled or having substantially the same elevation. Consequently, divot height may be greatly reduced and the divot dimensions and the effects on FN tunneling may become substantially insignificant.

Referring to FIG. 9D, the dielectric or NV gate stack 936 deposition begins with the formation of tunnel dielectric 928 over at least channel 924 of multi-level NVM transistor 926 in the first region 906 of substrate 904, and may spread over to second region 908 of substrate 904 where MOS transistors 912, 914, 915 to be formed. The tunnel dielectric 928 may be any material and have any thickness suitable to allow charge carriers to tunnel into an overlying charge-trapping layer under an applied gate bias while maintaining a suitable barrier to leakage when multi-level NVM transistor 926 is unbiased. In certain embodiments, tunnel dielectric 928 may be silicon dioxide, silicon oxy-nitride, or a combination thereof and may be grown by a thermal oxidation process, using ISSG or radical oxidation.

In one embodiment a silicon dioxide tunnel dielectric 928 may be thermally grown in a thermal oxidation process in a furnace. However, thermally grown tunnel dielectric 928 may have a low density and may contribute to having interface charge traps at the interfaces between tunnel dielectric 928 and substrate 904 and between tunnel dielectric 928 and first charge-trapping layer 930 a (see FIG. 9D). In one embodiment, a majority of interface charge traps are shallow traps (closer to conduction band), as described in FIG. 6B, that may adversely affect retention performance and $I_D/V_T$ sigma degradation.

Figure 10C:
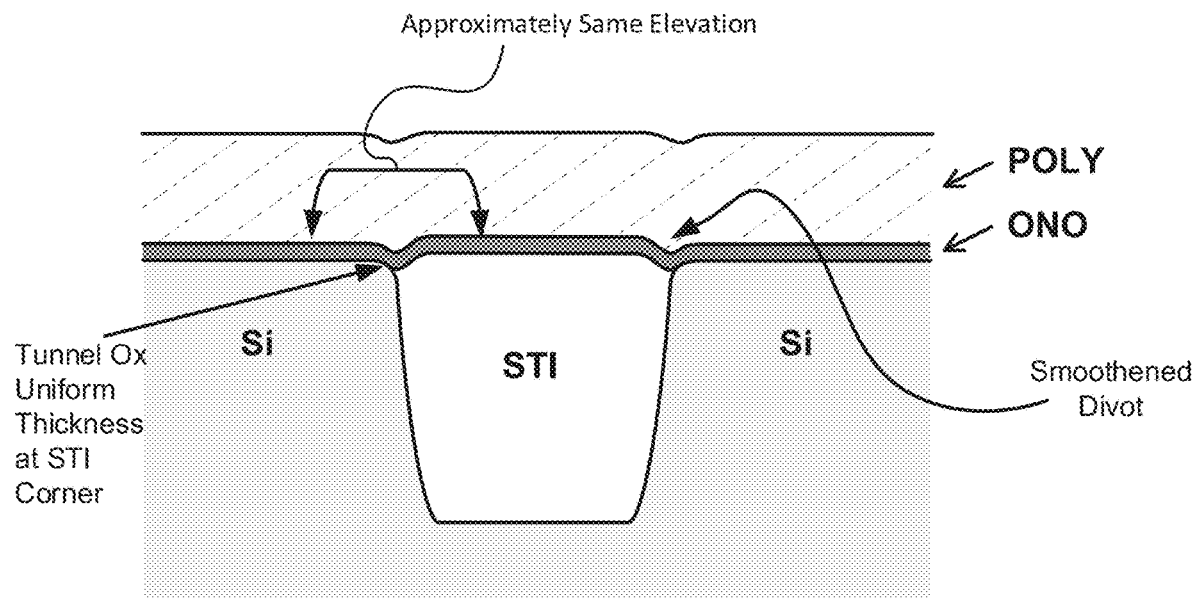

In another embodiment, as may be referred to as a preferred embodiment, a silicon dioxide tunnel dielectric 928 may be grown in a radical oxidation process, such as an ISSG process, involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an HO$_2$ radical or an O diradical, at the surface of substrate. The radical oxidation process is carried out for a duration approximately in the approximate range of about 1 to about 10 minutes to effect growth of a tunnel dielectric 928 having a thickness of from about 1.0 nanometers (nm) to about 4.0 nm by oxidation and consumption of the exposed surface of substrate. In one embodiment, tunnel dielectric 928 grown in a radical oxidation process may be both denser and composed of substantially fewer hydrogen atoms per cm$^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 928 without impacting the throughput (substrates/hr.) requirements that a fabrication facility may require. In one embodiment, tunnel dielectric 928 formed by an ISSG process has a more uniform thickness compared to thermally grown tunnel dielectric. Referring to FIGS. 10B and 10C, the uniform thickness of tunnel dielectric 928, especially around the STI corner, may reduce the non-uniformity of FN injection in the STI corner of the SONOS device. This will lead to better sigma of $I_D$ or $V_T$.

Referring again to FIG. 9D, a charge-trapping layer is formed on or overlying the tunnel dielectric 928. Generally, as best shown in FIG. 9D, the charge-trapping layer may be a multi-layer charge-trapping layer 930 comprising multiple layers including at least a lower or first charge-trapping layer 930 *a* which is physically closer to the tunnel dielectric 928, and an upper or second charge-trapping layer 930 *b* that is oxygen-lean relative to the first charge-trapping layer, and comprises a majority of a charge traps distributed in multi-layer charge-trapping layer 930.

The first charge-trapping layer 930 *a* of multi-layer charge-trapping layer 930 may include a silicon nitride (Si$_3$N$_4$), silicon-rich silicon nitride or a silicon oxy-nitride (SiO$_x$N$_y$(HO)) layer. For example, the first charge-trapping layer 930 *a* may include a silicon oxynitride layer having a thickness of between about 2.0 nm and about 6.0 nm formed by a CVD process using dichlorosilane (DCS)/ammonia (NH$_3$) and nitrous oxide (N$_2$O)/NH$_3$ gas mixtures in ratios and at flow rates tailored to provide a silicon-rich and oxygen-rich oxynitride layer.

The second charge-trapping layer 930 *b* of the multi-layer charge-trapping layer 930 is then formed, either directly or indirectly, over the first charge-trapping layer 930 *a*. In one embodiment, the second charge-trapping layer 930 *b* may include a silicon nitride and silicon oxy-nitride layer having a stoichiometric ratio of oxygen, nitrogen and/or silicon that is different from that of the first charge-trapping layer 930 *a*. The second charge-trapping layer 930 *b* may include a silicon oxynitride layer having a thickness of between about 2.0 nm and about 8.0 nm, and may be formed or deposited by a CVD process using a process gas including DCS/NH$_3$ and N$_2$O/NH$_3$ gas mixtures in ratios and at flow rates tailored to provide a silicon-rich, oxygen-lean top nitride layer. In one embodiment, the flowrate of nitrous oxide (N$_2$O)/ammonia (NH$_3$) gas mixtures during the formation of the second charge-trapping layer 930 *b* may be increased compared to a regular operation, while the flowrate of dichlorosilane (DCS)/ammonia (NH$_3$) during the formation of the first charge-trapping layer 930 *a* may be reduced. The combination of the changes in flowrate may form charge-trapping layer 930 that has a high density of deep traps, as best shown in FIG. 6B.

In another embodiment, there may be a thin dielectric and/or oxide layer 930 *c* formed between the first and second charge-trapping layers 930 *a* and 930 *b*, making the multi-layer charge trapping layer 930 an NON stack. In some embodiments, the multi-layer charge-trapping layer 930 is a split charge-trapping layer, further including a thin, middle oxide layer 930 *c* separating the first (lower) and second (upper) charge-trapping layers 930 *a* and 930 *b*. The middle oxide layer 930 *c* substantially reduces the probability of electron charge that accumulates at the boundaries of the second charge-trapping layer 930*b* during programming from tunneling into the first charge-trapping layer 930*a*, resulting in lower leakage current than for the conventional memory devices. In one embodiment, the middle oxide layer 930 *c* may be formed by oxidizing to a chosen depth of the first charge-trapping layer 930 *a* using thermal or radical oxidation.

As used herein, the terms "oxygen-rich" and "silicon-rich" are relative to a stoichiometric silicon nitride, or "nitride," commonly employed in the art having a composition of (Si$_3$N$_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 9D, the number of dielectric layers further includes cap layer 932 formed on or overlying charge-trapping layer 930 or second charge-trapping layer 930 *b*. In some embodiments, such as that shown, cap layer 932 is a multi-layer cap layer including at least a lower or first cap layer 932 *a* overlying the charge-trapping layer 930, and a second cap layer 932 *b* overlying the first cap layer 932 *a*.

In one embodiment, first cap layer 932 *a* may include a high-temperature-oxide (HTO), such as silicon oxide (SiO$_2$), having a thickness of between 2.0 nm and 4.0 nm deposited using a low pressure chemical vapor deposition (LPCVD) thermal oxidation process. In one embodiment, second cap layer 932 *b* may include a silicon nitride, a silicon-rich silicon nitride or a silicon-rich silicon oxynitride layer having a thickness of between 2.0 nm and 4.0 nm formed by a CVD process using N$_2$O/NH$_3$ and DCS/NH$_3$ gas mixtures.

Referring still to FIGS. 8 and 9D, a sacrificial oxide layer 934 is formed on or overlying cap layer 932. In one embodiment, sacrificial oxide layer 934 may include a high-temperature-oxide (HTO) layer grown by a thermal oxidation process or radical oxidation, and having a thickness of between 2.0 nm and 4.0 nm.

Next, still referring to FIGS. 8 and 9D, a patterned mask layer is formed on or overlying the sacrificial oxide layer 934, and referring to FIG. 9E, the sacrificial oxide layer 934, cap layer 932 and charge-trapping layer 930, and tunnel dielectric layer 928 are etched or patterned to form NV gate stack 936. In one embodiment, NV gate stack 936 may be disposed substantially overlying channel 924 of multi-level NVM transistor 926 in first region 906. The etching or patterning process may further remove various dielectric layers of NV gate stack 936 from second region 908 of substrate 904 (step 806). The patterned mask layer 980 may include a photoresist layer patterned using standard lithographic techniques, and the NV gate stack 936 layers in second region 908 may be etched or removed using a dry etch process including one or more separate steps to stop on a surface of substrate 904 or unremoved pad oxide 909 (if any). In one embodiment, well 950 for HV MOS transistor 914 may be formed.

Figure 9F:
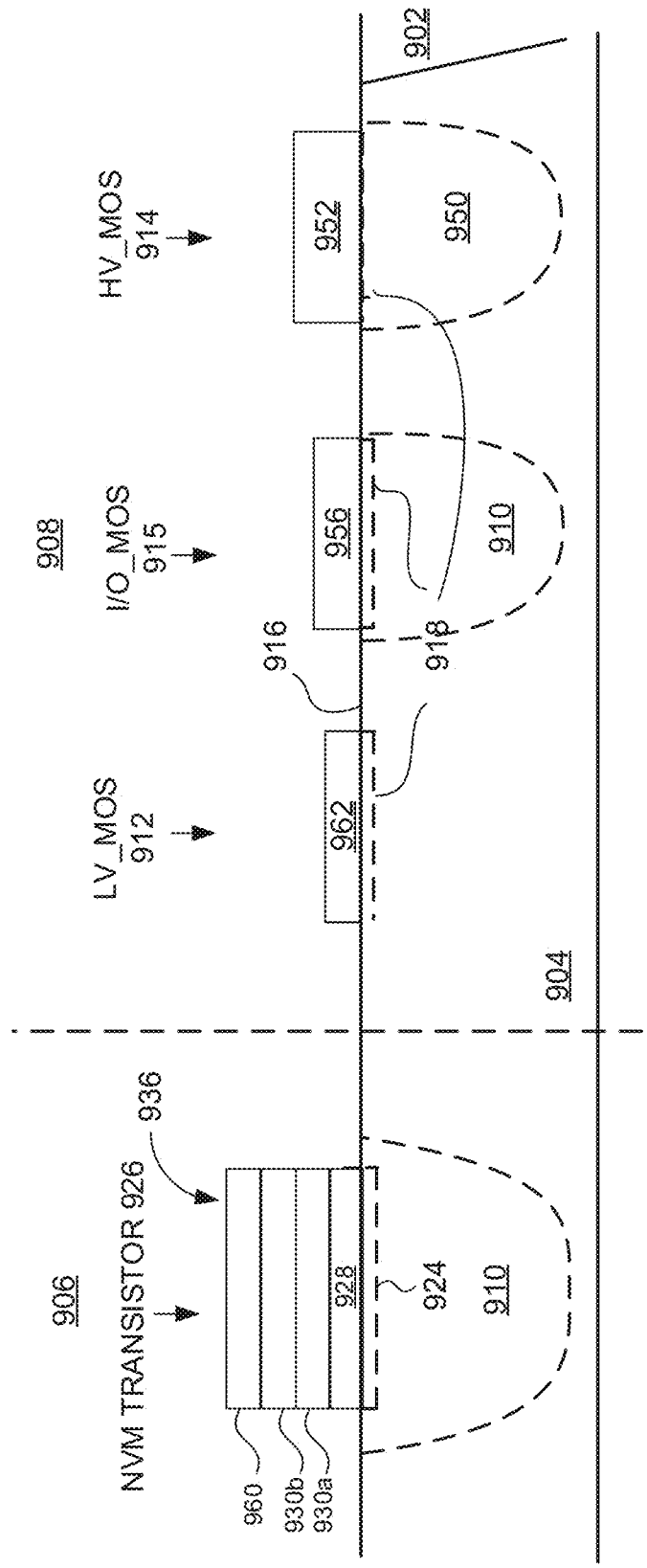

Referring to FIGS. 8, 9E, and 9F, sacrificial oxide layer 934 and a top portion or substantially all of second cap layer 932 b in the multi-layer cap layer 932 are removed from NV gate stack 936 in a highly selective cleaning process (step 808). This cleaning process further removes any oxide, such as oxide in tunnel dielectric 928 and/or pad oxide 909, remaining in the first region 906 beyond NV gate stack 936, and in second region 908 to prepare substrate 904 for oxide growth.

Next, referring to FIG. 8 and FIG. 9F, blocking oxide layer 960 of multi-level NVM transistor 926 and LV gate oxide 962 layer, I/O gate oxide 956 layer, and HV gate oxide 952 layer are formed, in step 808. In one embodiment, an oxidation process is performed to oxidize the remaining portion of second cap layer 932 b and/or the first cap layer 932 a of multi-layer, cap layer 932, and optionally, a portion of second charge-trapping layer 930 b to form blocking oxide layer 960 overlying second charge-trapping layer 930 b. In one embodiment, the oxidation process is adapted to oxidize or consume first cap layer 932 a, or the remaining portion of second cap layer 932 b, or optionally a portion of second charge-trapping layer 930 b to form the blocking oxide layer 960 in the first region while simultaneously oxidizing at least a portion of substrate surface 916 overlaying channels 918 of I/O MOS 915 or LV MOS 912 or HV MOS 914 to form gate oxide layer(s) in the second region. In one embodiment, the oxidation process may include in-situ-steam-generation (ISSG), or other radical oxidation processes performed in a batch or single substrate processing chamber with or without an ignition event such as plasma. For example, in one embodiment blocking oxide layer 960 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of remaining second cap layer 932 b or first cap layer 932 a. The radical oxidation process may be carried out for a duration approximately in the range of 10-15 minutes to effect growth of blocking oxide layer 960 by oxidation and consumption of the multi-layer cap layer 932 and optionally a portion of the second charge-trapping layer 930 b having a thickness of from about 3 nm to about 4.5 nm. In one embodiment, the ISSG process may produce a better quality and density blocking oxide layer 960 and may contribute to having lower density of interface charge traps at the interfaces between blocking oxide layer 960 and second charge-trapping layer 930 b. A majority of these interface charge traps are shallow traps, as described in FIG. 6B, that may adversely affect retention performance and $I_D/V_T$ sigma degradation. Therefore, blocking oxide produced by ISSG process will improve the retention performance of the SONOS device.

Referring to FIGS. 8 and 9F, LV gate oxide 962 layer, I/O gate oxide 956 layer, and HV gate oxide 952 layer may be formed using RTO, furnace oxidation, radical oxidation, CVD, ISSG, or combinations thereof. In embodiments, LV gate oxide 962 layer, I/O gate oxide 956 layer, and HV gate oxide 952 layer may be formed simultaneously or individually. Subsequently, LV gate oxide 962 layer, I/O gate oxide 956 layer, and HV gate oxide 952 layer are patterned, in step 808.

Figure 9G:
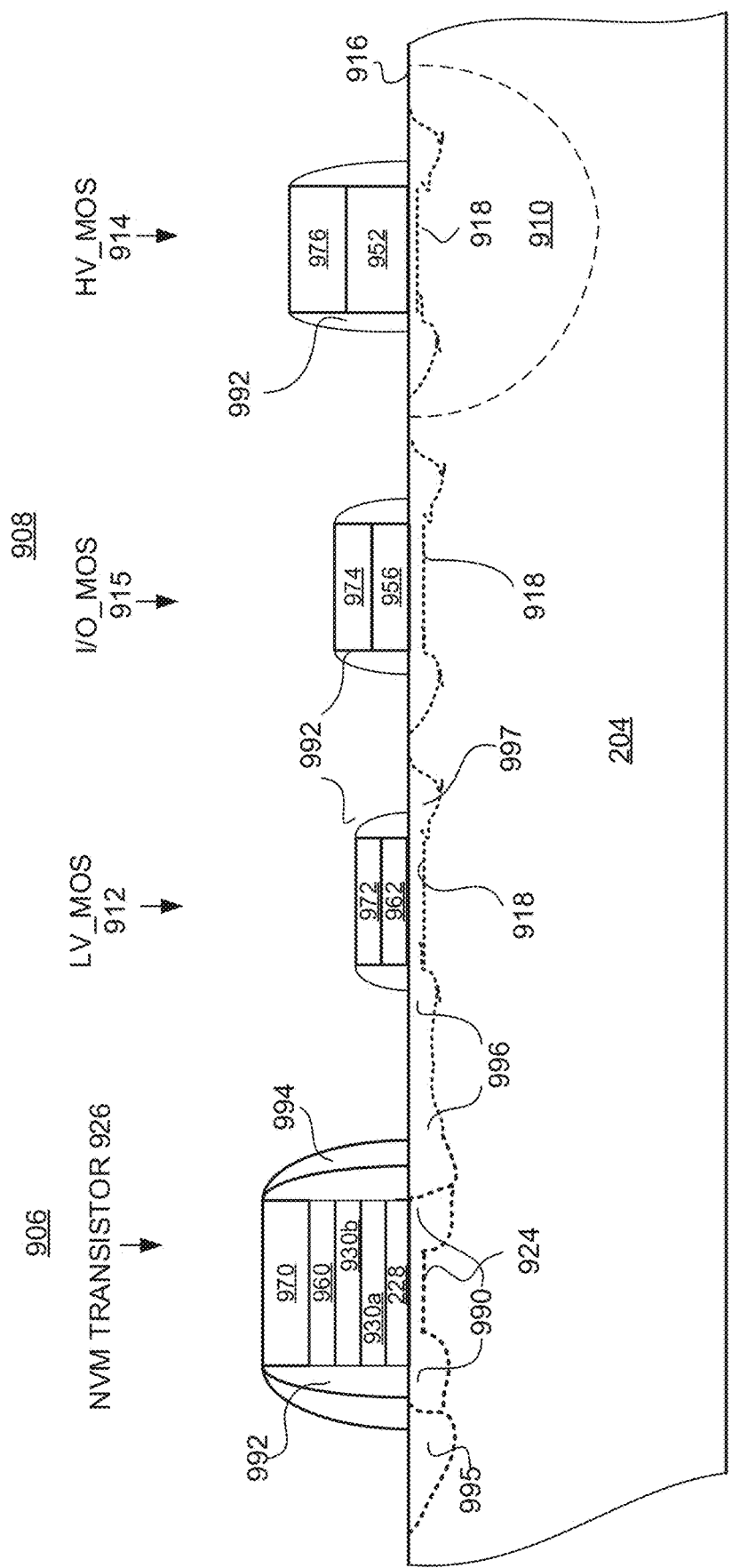

Referring to FIGS. 8 and 9G, gate layer of any conducting or semiconducting material suitable for accommodating a biasing of the multi-level NVM transistor 926 and operation of HV MOS transistor 914, I/O MOS transistor 915, and LV MOS transistor 912, may be formed over NV gate stack 936 in the first region 906, and gate oxide layers 952, 956 and 962 in the second region 908 (step 810).

In one embodiment, the gate layer may be formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer may be formed by a CVD process and composed of a single doped polysilicon layer, which may then be patterned to form control gates of the multi-level NVM transistor 926 and MOS transistors 914, 915, 912.

Referring to FIG. 9G again, gate layer is subsequently patterned using a mask layer (not shown) and standard lithographic techniques to form gate 970 for NV gate stack 936 of multi-level NVM transistor 926, gate 972 for LV MOS transistor 912, gate 974 for I/O MOS transistor 915, and gate 976 for HV MOS transistor 914 (step 810). In one embodiment, gate 970 for NV gate stack 936 of multi-level NVM transistor 926, gate 272 for HV MOS transistor 914, gate 274 for I/O MOS transistor 915, and gate 276 for LV MOS transistor 912 may be formed concurrently. In alternative embodiments, the aforementioned gates may be formed consecutively, or in groups.

Referring to FIGS. 8 and 9G, a first spacer layer is deposited and etched to form first sidewall spacers 992 adjacent to the gates 972, 974, 976, of the MOS transistors 912, 915, 914, and gate 970 of multi-level NVM transistor 926, and one or more lightly-doped drain extensions (LDD 990) may be implanted adjacent to and extend under sidewall spacers 992 of multi-level NVM transistor 926 and one or more of the MOS transistors 912, 914, 915 (step 812).

Figure 10D:
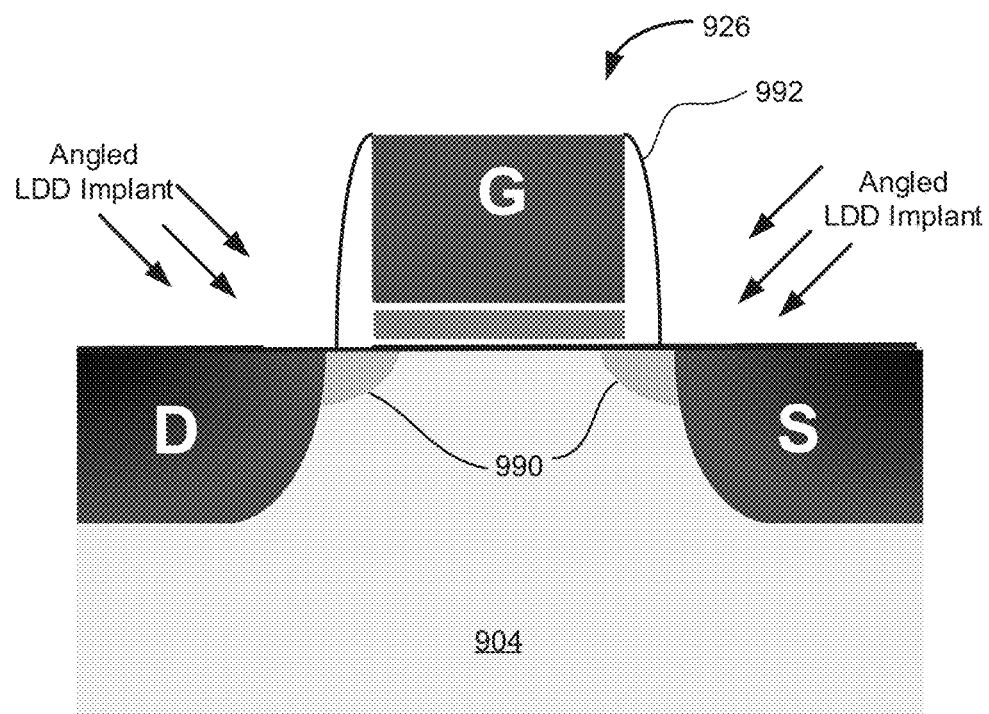

FIG. 10D is a schematic block diagram illustrating an embodiment of a multi-level NVM transistor 926 with LDD extensions 990 according to the present disclosure. In one embodiment, first sidewall spacers 992 may have a relatively thin length, e.g. 100 Å-200 Å, such that lightly-doped drain LDD 990 extensions may be formed more effectively. As best shown in FIG. 10D, lightly-doped drain LDD 990 extensions may be formed at least partly under NV gate stack 936 and control gate 970 of NVM transistor 926, in step 812. In one embodiment, LDD 990 may be formed by angled implant of n-type material, such as phosphorus, such that LDD 990 may be disposed at least partly under the ONO and CG stack of multi-level NVM transistor 926. In one embodiment, angled LDD implant is formed using low implant dose in an approximate range of 1e12-1e15 atoms per $cm^2$, a high energy in an approximate range of 2 keV-20 keV, and a tilt angle in an approximate range of 0 to 30 degree. In one embodiment, the lower dose and higher energy LDD 990 at the internal node and drain of NVM transistor 926 may help reduce gate induced drain leakage (GIDL) current which is a feed current for possible secondary impact ionization hot electron (SIIHE). The GIDL current leakage reduction may help improve retention performance and $I_D/V_T$ sigma degradation of NVM transistor 926. In one embodiment, drain region 995 of multi-level NVM transistor 926, internal node region 996, source region 997 of LV MOS transistor 912 may be formed.

Referring to FIG. 9G, subsequently, a second spacer layer is deposited and etched to form second sidewall spacers 994 adjacent to NV gate stack 936, of the multi-level NVM transistor 926. In one embodiment, the multi-level NVM transistor 926, HV MOS transistor 914, I/O MOS transistor 915, and LV MOS transistor 912 are substantially completed, source and drain implants are performed to form source and drain regions for all transistors including drain region 995 of multi-level NVM transistor 926, internal node 996, and source region 997 of LV MOS transistor. A silicide process may be performed subsequently. In one or more alternative embodiments, fabrication steps as illustrated and described in FIGS. 8 to 9G may be adapted or modified to manufacture a floating gate based NVM transistor, instead of or additional of the SONOS based multi-level NVM transistor 926 in an integrated baseline CMOS process. It will be the understanding that more than one of multi-level NVM transistor 926, LV MOS transistor 912, I/O MOS transistor 915, and HV MOS transistor 914 may be formed concurrently using the process flow as described in FIGS. 8 to 9G.

Finally, the standard or baseline CMOS process flow is continued to substantially complete the front end device fabrication (step 816). In one embodiment, completed multi-level NVM transistor 926 and LV MOS transistor 912 may be configured to form an embodiment of a multi-level NVM cell 90 or 1310, such as the embodiments best shown in FIG. 2 or FIG. 13.

Figure 11:
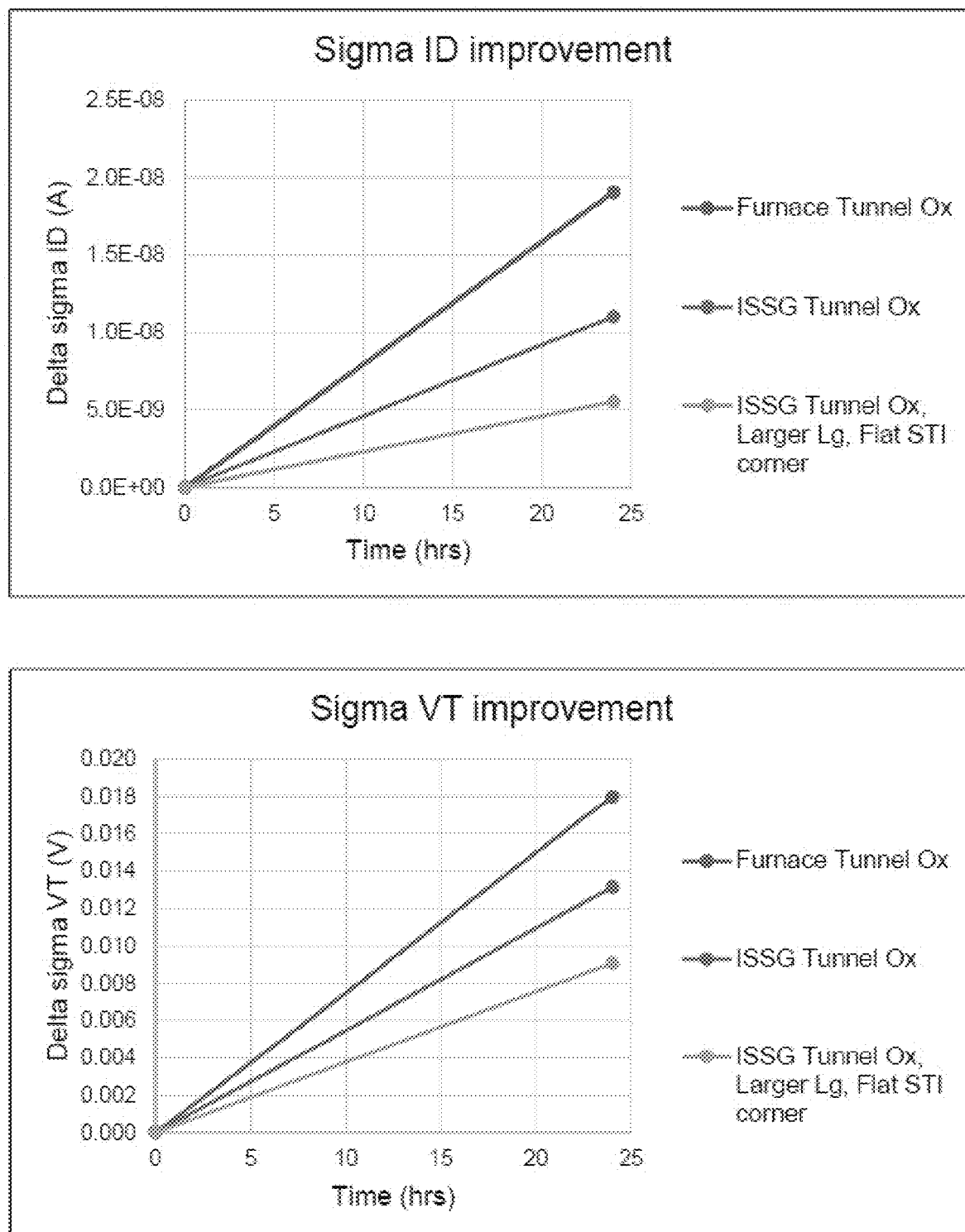
FIG. 11 are representative graphs illustrating effects of structural optimization on $I_D$ and $V_T$ sigma of SONOS cells.

FIG. 11 are representative graphs illustrating effects of structural optimization on $I_D$ and $V_T$ sigma of SONOS cells. As explained earlier, modifications in fabrication processes, including but not limited to STI corner smoothening, under-gate LDD, good quality tunnel oxide, blocking oxide, and shallow traps reduction in charge-trapping layer of multi-level NVM transistor may help improve retention performance and $I_D/V_T$ sigma degradation.

Referring to FIG. 7, with structural optimization described in FIGS. 8-10D, deep traps density in the charge-trapping layer of multi-level NVM transistor 926 may be raised while the shallow traps density may be reduced. However, with conventional write algorithm using only hard erase and hard program operations (in FIGS. 3A and 3B), such as in NOR Flash or EEPROM, charges tend to be trapped in both shallow traps and deep traps. In one embodiment, more charges may be trapped in deep traps with a write algorithm using a series of partial erase/program operations, such as soft erase, soft program, selective soft erase, anneal erase, and refill program operations to nudge $I_D/V_T$ of multi-level NVM cells to their respective targets and may help redistributing charges from shallow traps to deep traps. In one embodiment, the partial erase and program operations may empty the charges from shallow traps and fill deep traps instead. As a result, both $I_D/V_T$ sigma degradation and retention of multi-level NVM cells may be improved. In one embodiment, a verification read operation that resembles a regular read operation, may be performed after each partial program or erase operation to determined how the reduced (partial program) or raised (partial erase) $I_D/V_T$ level compared to the target $I_D/V_T$ level. The results of verification read may be used to determine remaining sequence of the partial program/erase operations in the write algorithm.

Soft Erase Operation:

In one embodiment, the operating voltages coupled to various nodes for a soft erase operation is similar to a hard erase operation as previously described in FIG. 3A. Therefore, a full erase voltage 8 V ($V_{NEG}$–$V_{POS}$) is still impressed between CGs and substrate/drain. In contrast to the hard erase operation, the WLS pulse (e.g. WLS0, WLS1) duration of a soft erase pulse is significantly shorter (T soft erase ~20 µs), compared to Te~10 ms of a hard erase operation. Despite the same CG to drain voltage difference (e.g –8 V), the shorter soft erase pulse may only boost but not move $I_D$ of NVM cells in the selected row 0 (e.g. C1, C2) to the Erased $I_D$ level. In one embodiment, a soft erase operation may only be performed on the entire selected row.

Anneal Erase Operation:

The general purpose of an anneal erase operation is to de-trap charges in shallow traps to improve the post-retention performance. Table III depicts exemplary bias voltages that may be used for an anneal erase operation of page/row 0 of a non-volatile memory having a 2T-architecture and including memory cells with N-type SONOS transistors and CSLs, resembling 2×2 array 300 as best shown in FIG. 3A.

TABLE III

| Node | Voltages (V) | Voltage Range (V) |
| --- | --- | --- |
| WLS0 | $V_{NEG}$ e.g. –3.8 V | –4.0 V to –2.0 V |
| BL0 | $V_{AEPOS}$ e.g. +2.2 V | +1.8 V to +2.4 V |
| WL0 | $V_{PWR}$ e.g. +1.1 V | +1.0 V to +1.2 V |
| SPW | $V_{AEPOS}$ e.g. +2.2 V | +1.8 V to +2.4 V |
| DNW | $V_{AEPOS}$ e.g. +2.2 V | +1.8 V to +2.4 V |
| CLS0 | $V_{AEPOS}$ e.g. +2.2 V | +1.8 V to +2.4 V |
| WLS1 | $V_{AEPOS}$ e.g. +2.2 V | +1.8 V to +2.4 V |
| BL1 | $V_{AEPOS}$ e.g. +2.2 V | +1.8 V to +2.4 V |
| WL1 | $V_{PWR}$ e.g. +1.1 V | +1.0 V to +1.2 V |

In one embodiment, unlike the erase and soft erase operations, a softer erase voltage ($V_{NEG}$–$V_{AEPOS}$) is impressed between CGs and substrate/drain as $V_{AEPOS}$ may have a lower magnitude than $V_{POS}$. The softer or lower erase voltage (e.g. 6 V vs. 8 V) is however applied to CGs for a much longer pulse duration, T anneal erase 50 ms. In one embodiment, the softer erase pulse may help remove charges in shallow traps that are closer to the conduction band. In one embodiment, an anneal erase operation may only be performed on the entire selected row.

Figure 12A:
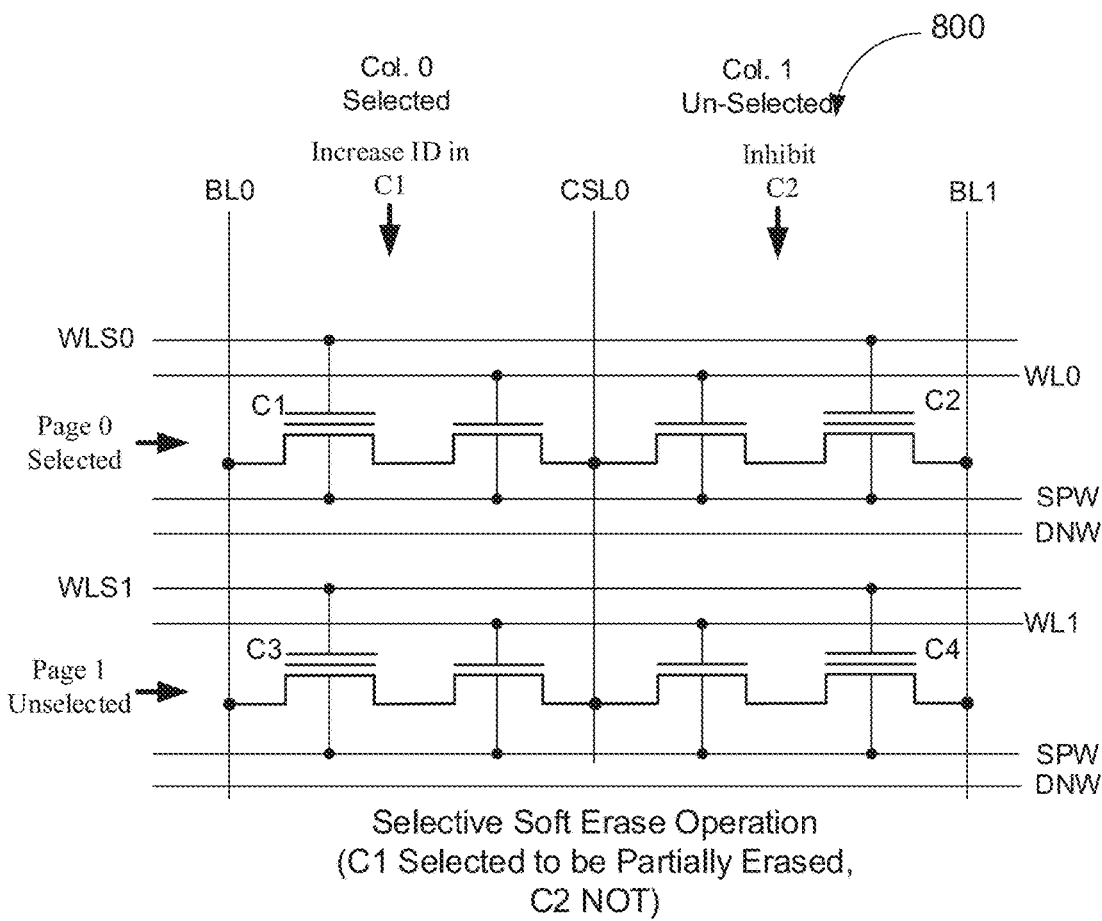
FIG. 12A is a schematic diagram of a segment of a SONOS based non-volatile memory array illustrating an embodiment of a selective soft erase operation according to the present disclosure.

Selective Soft Erase:

FIG. 12A illustrates a 2×2 array 800 of NVM array 100 to demonstrate an embodiment of a selective soft erase operation according to the present disclosure. In one embodiment, 2×2 array 800 may be similar to the 2×2 array 300 in FIGS. 3A and 3B. In the following description, for clarity and ease of explanation, it is assumed that all of the transistors in 2×2 array 800 are N-type transistors. It should be appreciated, without loss of generality that a P-type configuration can be described by reversing the polarity of the applied voltages, and that such a configuration is within the contemplated embodiments of the disclosure. In addition, the voltages used in the following description are selected for ease of explanation and represent only one exemplary embodiment of the subject matter. Other voltages may be employed in different embodiments.

Referring to FIG. 12A, 2×2 memory array 800 includes at least four memory cells C1, C2, C3, and C4 arranged in two rows and two columns. While NVM cells C1-C4 may be disposed in two adjacent columns (common source line CSL0), they may be disposed in two adjacent rows, or two non-adjacent rows. Each of the NVM cells C1-C4 may be structurally similar to NVM cell 90 as described above. Referring to FIGS. 3A, 3B, and 5, a hard erase operation as described in FIG. 3A may raise the $I_D$ of erased NVM cells to the Erased $I_D$ level in FIG. 5, and similarly a hard program operation to the Programmed $I_D$ level in FIG. 5. In one embodiment, Erased and Programmed $I_D$ levels may be distributed beyond the operational range of $I_D1$ to $I_D2''$ of NVM array 100. In another embodiment, one of the Erased and Programmed $I_D$ levels may fall within the operational range.

Referring to FIG. 12A, for example, page 0 is selected to be erased and page 1 is not (unselected) for a selective soft erase (SSE)/inhibit operation. In contrast to the hard, soft, and anneal erase operation embodiments explained previously, wherein a single page or row is the smallest erase block of NVM cells 90, a single NVM cell/bit or multiple NVM cells/bits in the same row (e.g. page 0) may be selected for a selective soft erase operation. The unselected NVM cells (e.g. C2) may be inhibited instead. Therefore, only selected NVM cell(s) including C1 in a selected row (page 0) has its $I_D$ level boosted (partially erased) by applying the appropriate voltages to a SONOS word line (WLS0) shared by all NVM cells in row 0, the substrate connections and to all bit lines in NVM array 100. In one embodiment, a selective soft erase (SSE) negative voltage $V_{SSENEG}$ is applied to WLS0, and a SSE positive voltage $V_{SSEPOS}$ is applied to BL0 and DNW of all NVM cells in page 0. In one embodiment, $V_{SSENEG}$ has a smaller absolute magnitude compared to $V_{NEG}$ used in the hard erase operation in FIG. 3A, and $V_{SSEPOS}$ has a greater absolute magnitude than $V_{POS}$ in FIG. 3A. $V_{EINHIB}$ is applied to WL0, SPW, BL1, and WL1 to inhibit the soft erase operation of unselected NVM cell(s), such as C2, from having its $I_D$ boosted. CLS0 and WLS1 are either coupled to ground or 0 V. In one embodiment, SGs of all NVM cells C1 to C4 are turned off (WL=−1.4 V), which are usually turned on for a hard erase operation.

In one embodiment, despite the smaller absolute magnitude of $V_{SSENEG}$, a relatively full erase voltage bias ($V_{SSENEG}-V_{SSEPOS}$=−7.2 V) is still impressed between CG and BL0 of memory transistor in C1 only. The voltage difference between CG and BL1 in unselected C2 is only ($V_{SSENEG}-V_{EINHIB}$=−0.9 V). Therefore, $I_D$ of only the selected C1 may be boosted but not the unselected C2 in the same selected row 0. In one embodiment, the pulse duration of selected erase operation (Tsse~20 μs) coupled to WLS0 is much shorter than that in a hard erase operation (Te~10 ms). The shorter SSE pulse may not erase all previously trapped charges (if any) in NVM cell C1. In one embodiment, all word lines including WL0 and WL1 and SPW are coupled to $V_{EINHIB}$ such that unselected NVM cells C2, C3, and C4 may not be partially erased as in NVM cell C1. In one embodiment, the general idea of a selected erase operation is to impress a relatively high erase voltage difference or bias (e.g. 7.2 V) for a short period of time (20 μs) to reduce trapped charges in only the selected NVM cell(s) of the same row. In one embodiment, Tae>Te>Tsse and Tse. In one embodiment, more than one NVM cell may be selected for the SSE operation, while more than one NVM cell in the same row may be inhibit such that their $I_D$ level remain relatively unchanged.

Table IV depicts exemplary bias voltages that may be used for a selective soft erase operation of page/row 0 and column 0 (C1 only) of a non-volatile memory having a 2T-architecture and including memory cells with N-type SONOS transistors and CSLs, resembling 2×2 array 800.

TABLE IV

| Node | Voltages (V) | Voltage Range (V) |
|---|---|---|
| WLS0 | $V_{SSENEG}$ e.g. −2.3 V | −2.5 V to −1.5 V |
| BL0 | $V_{SSEPOS}$ e.g. +4.9 V | +3.0 V to +5.0 V |
| WL0 | $V_{EINHIB}$ e.g. −1.4 V | −1.6 to −0.8 |
| SPW | $V_{EINHIB}$ e.g. −1.4 V | −1.6 to −0.8 |
| DNW | $V_{SSEPOS}$ e.g. +4.9 V | +3.0 V to +5.0 V |
| CLS0 | Ground or 0 V | Ground or 0 V |
| WLS1 | Ground or 0 V | Ground or 0 V |
| BL1 | $V_{EINHIB}$ e.g. −1.4 V | −1.6 to −0.8 |
| WL1 | $V_{EINHIB}$ e.g. −1.4 V | −1.6 to −0.8 |

Soft Program Operation:

In one embodiment, the operating voltages coupled to various nodes for a soft program (SP)/inhibit operation is similar to a hard program/inhibit operation as previously described in FIG. 3B, except for the voltage coupled to the selected WLS (e.g. WLS0). In one embodiment $V_{SPPOS}$ has a magnitude lower than $V_{POS}$ in the hard program operation such that the program voltage impressed on CG of selected C1 may be reduced. Therefore, a soft program voltage bias 6 V ($V_{NEG}-V_{SPPOS}$) is impressed between CGs and BL/substrate/P-wells. In contrast to the hard program operation, the WLS pulse (e.g. WLS0, WLS1) duration of a soft program pulse is significantly shorter (Tsp~10 μs), compared to Tp~5 ms of a hard program operation. With the smaller CG to drain voltage difference (e.g 6 V vs. 8 V) and the shorter soft program pulse (10 μs vs. 5 ms), the soft program operation may only reduce but not move $I_D$ of the selected NVM cell C1 to the Programmed $I_D$ level. In one embodiment, unselected NVM cells, e.g. C2 on the same row and unselected row, e.g. C3 and C4 may be inhibited.

Figure 12B:
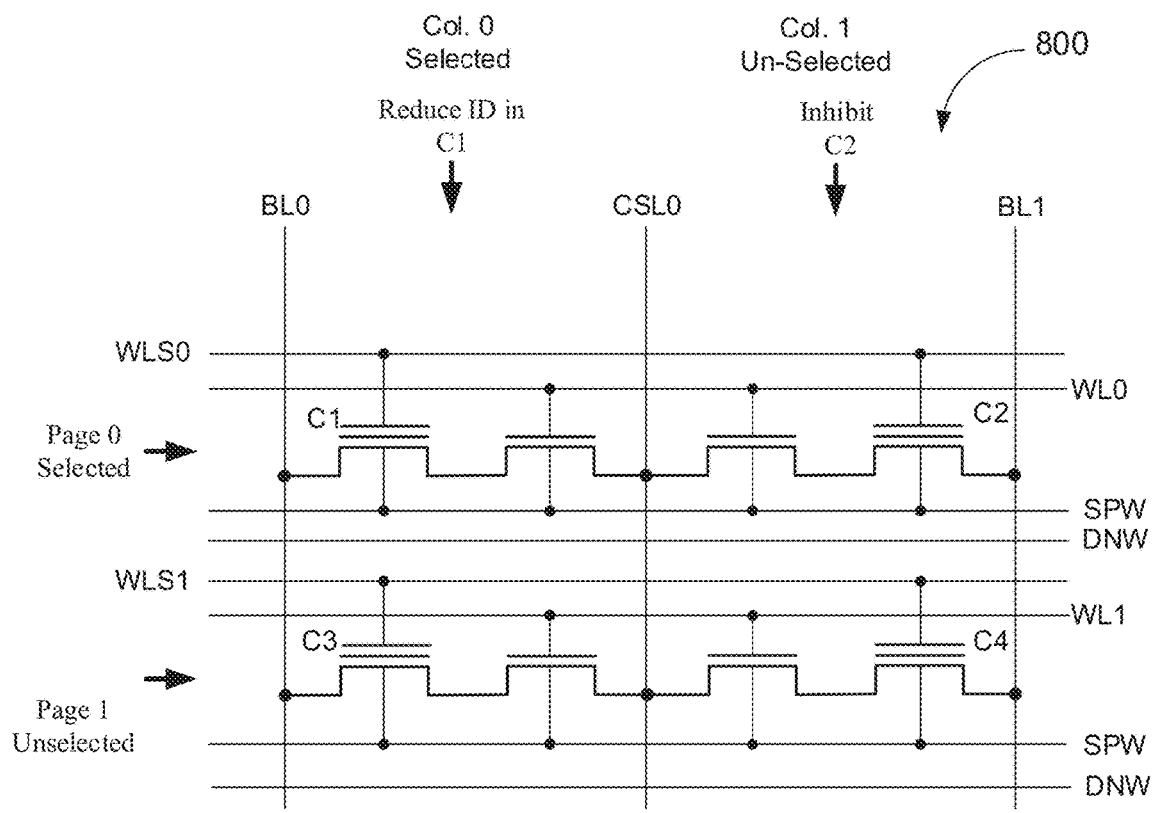
FIG. 12B is a schematic diagram of a segment of a SONOS based non-volatile memory array illustrating an embodiment of a refill program/inhibit operation according to the present disclosure.

Refill Program Operation:

FIG. 12B illustrates an exemplary embodiment of a segment 2×2 array 800 of NVM array 100, during a refill program (RP)/inhibit operation. Referring to FIG. 8B, for example, NVM cell C1 is the targeted cell to be partially programmed (reduce or move $I_D$ level towards the Programmed $I_D$ in FIG. 5) while NVM cell C2 is inhibited. It will be the understanding that C1 and C2, while being illustrated as two adjacent cells for illustrative purposes, may also be two separated NVM cells on the same row, such as row 0. The general purpose of a refill program operation is to fill charges in deep traps (see FIG. 7) using a high program voltage to improve the post-retention performance. Table V depicts exemplary bias voltages that may be used for a refill program operation of page/row 0 of a non-volatile memory having a 2T-architecture and including memory cells with N-type SONOS transistors and CSLs, resembling 2×2 array 800 as best shown in FIG. 8B.

In one embodiment, unlike the soft program operations, a harder program voltage bias ($V_{RPPOS}-V_{RPNEG}$) is impressed between CGs and substrate/drain as $V_{RPPOS}$ may have a comparable but higher magnitude than $V_{POS}$ and $V_{RPNEG}$ may have a comparable but higher magnitude than $V_{NEG}$. The resulting program voltage bias impressed on CG of selected C1 is therefore comparable but slightly higher than that in the hard program operation as described in FIG. 3B (e.g. 9 V vs. 8 V). The harder program pulse is however only applied to the selected CG(s) for a very brief duration, Trp~5 μs. The short refill program pulse may reduce $I_D$ of C1 but not fully program it. In one embodiment, Tp>Tsp>Trp. The hard program pulse of the refill program operation may help fill charges in deep traps that have energy level between the valence and conduction band as best shown in FIG. 6B. In one embodiment, similar to the hard program and soft program operations, unselected NVM cells C2, C3, C4, etc. may be inhibited. In one embodiment, the refill program operation may be performed after or before the anneal erase operation. The refill program operation may restore $I_D$ of selected NVM cells by re-filling charges in deep traps, which may be emptied out from shallow traps in the previous anneal erase operation.

Table V depicts exemplary bias voltages that may be used for refill programming NVM cell C1 in a non-volatile memory having a 2T-architecture and including memory cells with N-type SONOS transistors and CSLs.

TABLE V

| Node | Voltages (V) | Voltage Range (V) |
|---|---|---|
| WLS0 | $V_{RPPOS}$ e.g. +5 V | +3.8 V to +5.0 V |
| BL0 | $V_{RPNEG}$ e.g. −4 V | −4.0 V to −3.4 V |
| WL0 | $V_{RPNEG}$ e.g. −4 V | −4.0 V to −3.4 V |
| SPW | $V_{RPNEG}$ e.g. −4 V | −4.0 V to −3.4 V |
| DNW | $V_{INHIB}$ e.g. +1.1 V | +1.0 V to +1.2 V |
| CLS0 | Float/$V_{MARG}$ e.g. −2.4 V | −3.0 V to −2.0 V |
| WLS1 | $V_{MARG}$ e.g. −2.4 V | −3.0 V to −2.0 V |
| BL1 | $V_{INHIB}$ e.g. +1.1 V | +1.0 V to +1.2 V |
| WL1 | $V_{RPNEG}$ e.g. −4 V | −4.0 V to −3.4 V |

Figure 13:
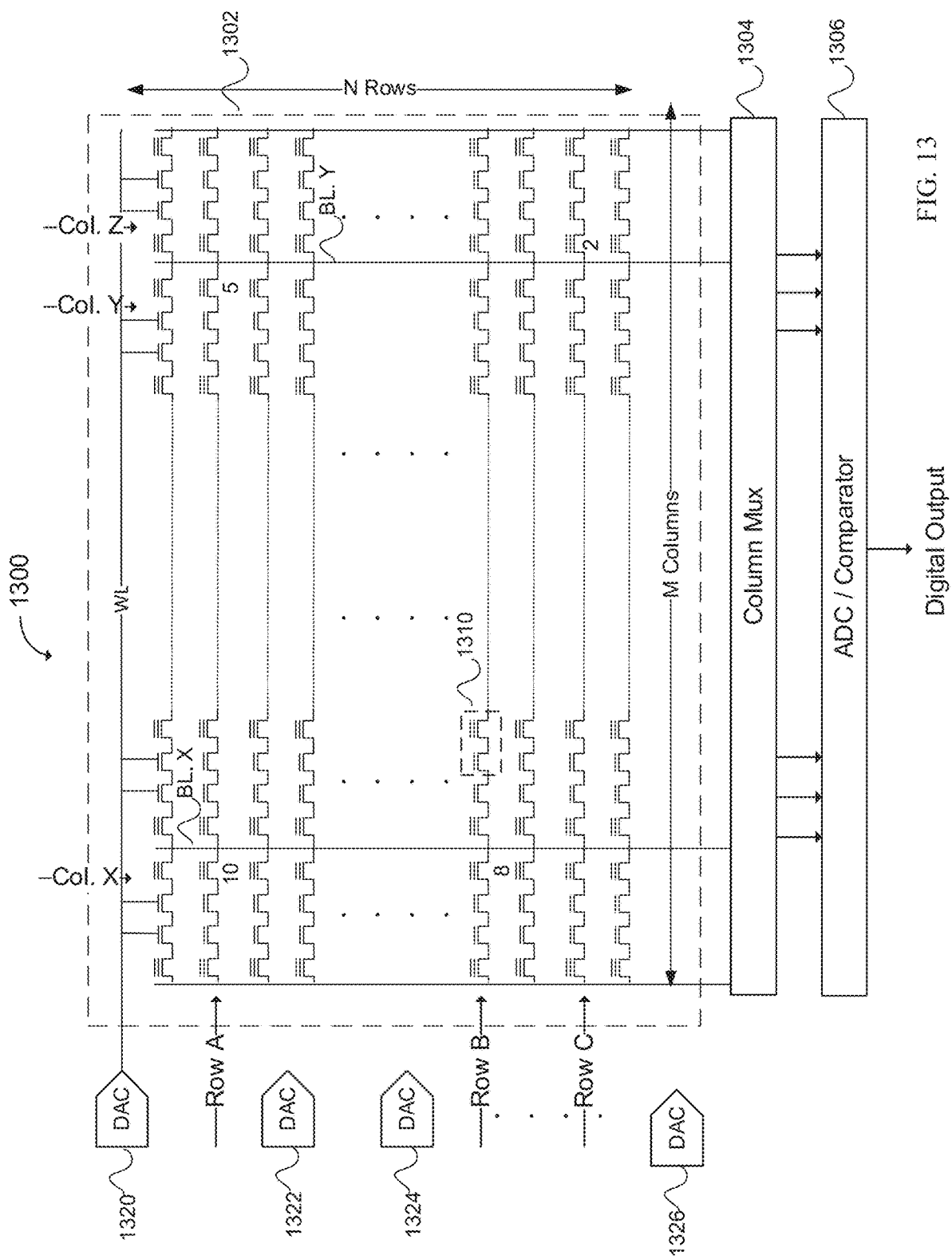
FIG. 13 is a schematic block diagram illustrating an embodiment of a SONOS based multi-level NVM device according to the present disclosure.

FIG. 13 is a schematic block diagram illustrating an embodiment of a multi-level or analog NVM device 1300 in accordance with the present subject matter. In one embodiment, multi-level NVM array 1302 may be similar to NVM array 100 in FIG. 2, wherein multi-level NVM cells 1310 are arranged in N rows and M columns. Multi-level NVM cells 1310 may be fabricated according to methods described in FIGS. 8-9G, wherein modifications in structural features, such as smoothen STI corners, under-date LDDs, etc. have been implemented. Each multi-level NVM cell 1310 may have a 2T configurations (SONOS transistor and FET transistor) and share a CSL with one neighboring cell of the same row. In one embodiment, other connections such as WLSs, WLs, BLs, SPW, DNW, etc. may also resemble the configurations in NVM array 100 in FIGS. 1A, 1B, and 2. The multi-level NVM cell 1310 may be configured to have more than two distinct $I_D/V_T$ levels (see FIG. 5), e.g. $2^4$=16 or 0 to 15 levels. In one embodiment, each multi-level NVM cell 1310 may store an analog value of 0-15, corresponding to its $I_D/V_T$ level when read. The analog values may be written to the multi-level NVM cells 1310 using a series of partial program/inhibit operations, partial erase/inhibit operations, and verification steps, as previously described. As an example, Row A, Col. X bit is written a 10 value ($I_D/V_T$ level=10), Row A. Col. Y bit a 5 value, Row B, Col. X bit an 8 value, and Row C, Col. Z a 2 value. In embodiments, multi-level NVM cells 1310 may be written to any analog value corresponding to their $I_D/V_T$ levels that are within the pre-defined $I_D/V_T$ level range (e.g. 0 to 15 for 16 $I_D/V_T$ levels). The aforementioned stored values may be used in examples of operation methods in later sections of this patent document for explanatory purposes only; and should not be construed as limitations. In alternative embodiments, stored analog values may be any pre-determined values that correspond to $I_D/V_T$ levels of multi-level NVM cells 1310.

In one embodiment, stored values of multiple multi-level NVM cells 1310 may be combined to store one analog value. For example, two multi-level NVM cells 1310 may be each configured to having 8 levels, one cell may store 0-7 values and the other −8-−1 values. When the two cells are read in one operation, the combined cells may be considered having 16 levels (−8-7) representing 16 analog values instead of 8. In other embodiments, more than two multi-level NVM cells 1310 may be combined such that higher number of levels may be achieved without further dividing the operating $I_D/V_T$ range of multi-level NVM cells 1310. In embodiments, combined cells may be disposed on adjacent columns of the same row or adjacent rows of the same column, or scattered in multi-level NVM array 1302 according to some predetermined algorithms. In one embodiment, multi-level NVM device 1300 may be utilized as a non-volatile storage device of analog values. In other embodiments, multi-level NVM device 1300 may be configured to perform as an inference device, performing arithmetic functions.

Referring to FIG. 13, multi-level NVM array 1302 may be coupled to column mux function 1304 via its bit lines (e.g. BL. X, Y). In one embodiment, column mux function 1304 may have multiplexors, capacitors, transistors, and other semiconductor devices. During a read operation, the 10 value of Row A, Col. X bit may be read out via BL. X to column mux function 1304, similar to a read operation of a digital NVM array. In one embodiment, multiple bits on the same column, such as Row A and B, Col. X may be selected in one read operation, such that the read out value is the sum of the two selected bits (10+8=18). In another embodiment, multiple bits on the same row, such as Row A, Col. X and Y may be selected for the same read operation. The column mux function 1304 may be configured to add up or subtract the two values (10+5=15 or 10−5=5). In another embodiment, multi-level NVM device 1300 may be configured to perform multiplication function. For example, the Row A, Col. X bit may be read 7 times in order to compute (7×10=70). Multiplication (M×stored values) may be performed by using M×multiple pulses on WL (coupled to SGs) or prolonging (by M times) pulse duration of one WL pulse. In one embodiment, as an example, the analog value "7" may be an input via digital-analog converter (DAC) 1320 from an external device, which may be coupled to a WL to a row of SGs. As best shown in FIG. 13, each DAC 1320-1326 may be coupled to one WL or multiple WLs. One of the functions of DAC 1320-1326 is to configure the selected row(s) for read operations. It will be the understanding that the number, configuration of DACs, and their coupling to NVM array 1302 shown in FIG. 13 is one of the examples for illustration purposes only. Other configurations may be possible, according to system requirements and design, without altering the general teaching of the present embodiment. In various embodiments, DACs 1320-1326, multi-level NVM array 1302 and column mux function 1304 may be configured to perform simple arithmetic functions, such as summation, multiplication, etc as illustrated in previous examples, with or without a CPU or GPU. In one embodiment, analog NVM device 1300 may perform functions of both a data storage device and an inference device.

Analog results from column mux function 1304 may then be inputted to analog-digital convertor (ADC) or comparator 1306, wherein the analog read out result may be converted to digital data and outputted. In one embodiment, the entire or a portion of multi-level NVM array 1302 may be refreshed or having its analog values re-written on a regular basis, such as every 24 hours or 48 hours or other durations. The refresh operation may minimize potential effects of $I_D/V_T$ levels shift or decay of programmed multi-level NVM cells due to retention, $I_D/V_T$ degradation as described in FIG. 7, or other causes. In another embodiment, analog NVM array 1302 may include reference cells (not shown in FIG. 13), wherein the common effects of potential $I_D/V_T$ levels shift may be subtracted from multi-level NVM cells 1310.

Figure 14:
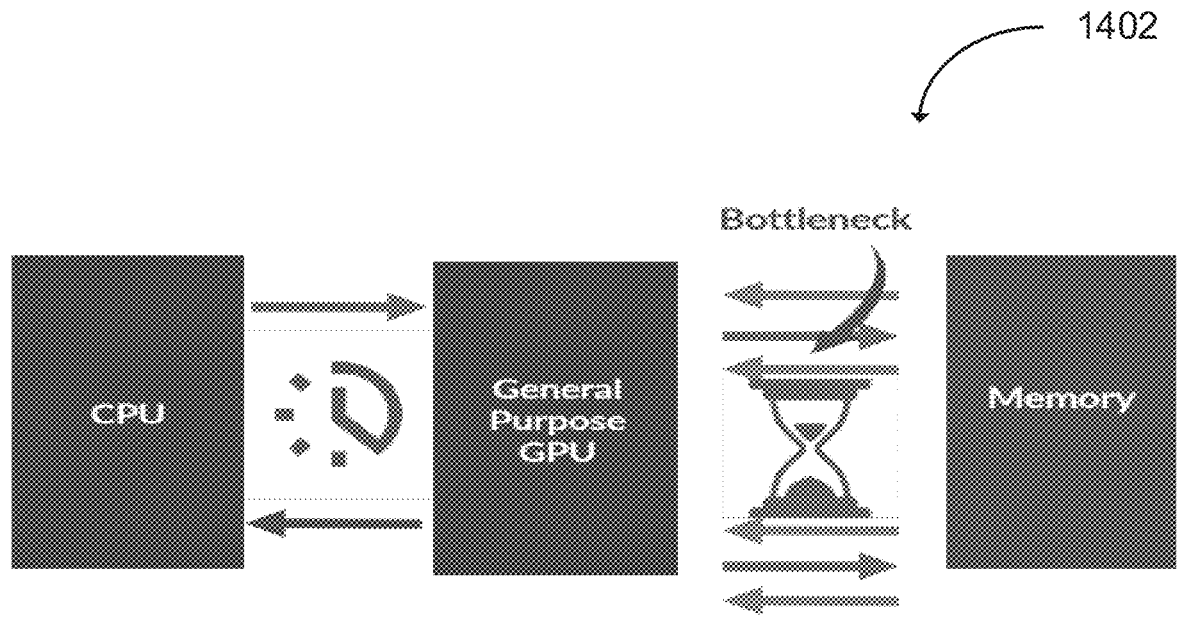
FIG. 14 is a representative block diagram illustrating an embodiment of a conventional digital multiply accumulate (MAC) system.
Figure 15:
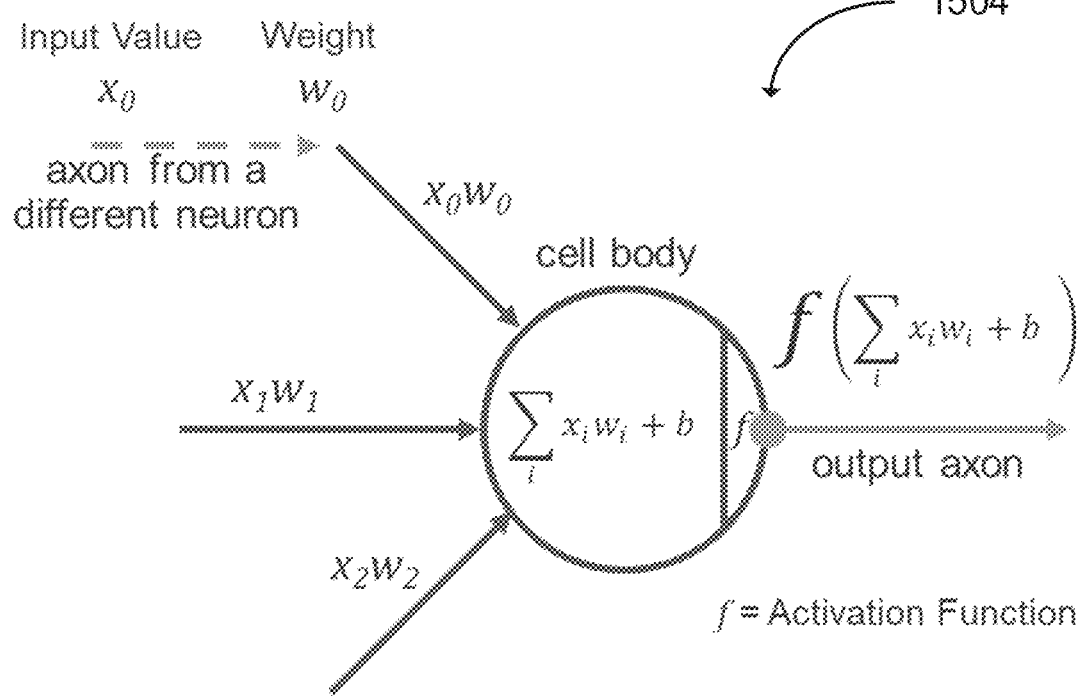
FIG. 15 is a representative diagram illustrating an embodiment of an artificial neuron of a deep neuron network (DNN) system.

FIGS. 14 and 15 are representative block diagrams respectively illustrating a Von-Neumann architecture of a multiply accumulate (MAC) system and an artificial neuron according to one embodiment of the present disclosure. Artificial Intelligence (AI) may be defined as the ability of a machine to perform cognitive functions executed by a human brain, such has reasoning, perception, and learning. Machine learning may use algorithms to find patterns in data and use a model that recognizes those patterns to make predictions on any new data or patterns. At the heart of AI applications or machine learning, there is the MAC or dot product operation, wherein it may take two numbers (input values and weight values), multiplies them together, and add the results to an accumulator. The artificial neuron 1504 in FIG. 15 may be a portion of a deep neural network (DNN) that features an example of a MAC operation. DNN mimics the functionalities of a human brain by implementing massively parallel computing (neuromorphic computing) architecture connecting low power computing elements (neurons) and adaptive memory elements (synapses). One reason for the rapid growth in machine learning is the availability of graphic processing units (GPUs). In a MAC application, such as system 1402, GPUs may perform necessary computations much faster than a general purpose CPU. One of the downsides of using GPUs for MAC operations is that GPUs tend to utilize floating-point arithmetic, which may be well beyond the needs of a relatively simple machine learning algorithms, like the MAC operations. Besides, AI applications, especially those run at the edge, may require MAC to run at high power efficiency to reduce power need and heat generation. The existing all digital Von-Nuemann architecture-based systems, like MAC system 1502, may also create major bottleneck issues between GPUs that do the computation and memory that only stores data (weight values, input values, output values, etc.) due to the frequent accesses of the memory. Therefore, there are needs to consider using low power consumption memory elements that may be configured to perform as an inference device, as well as a data storage device.

Figure 16:
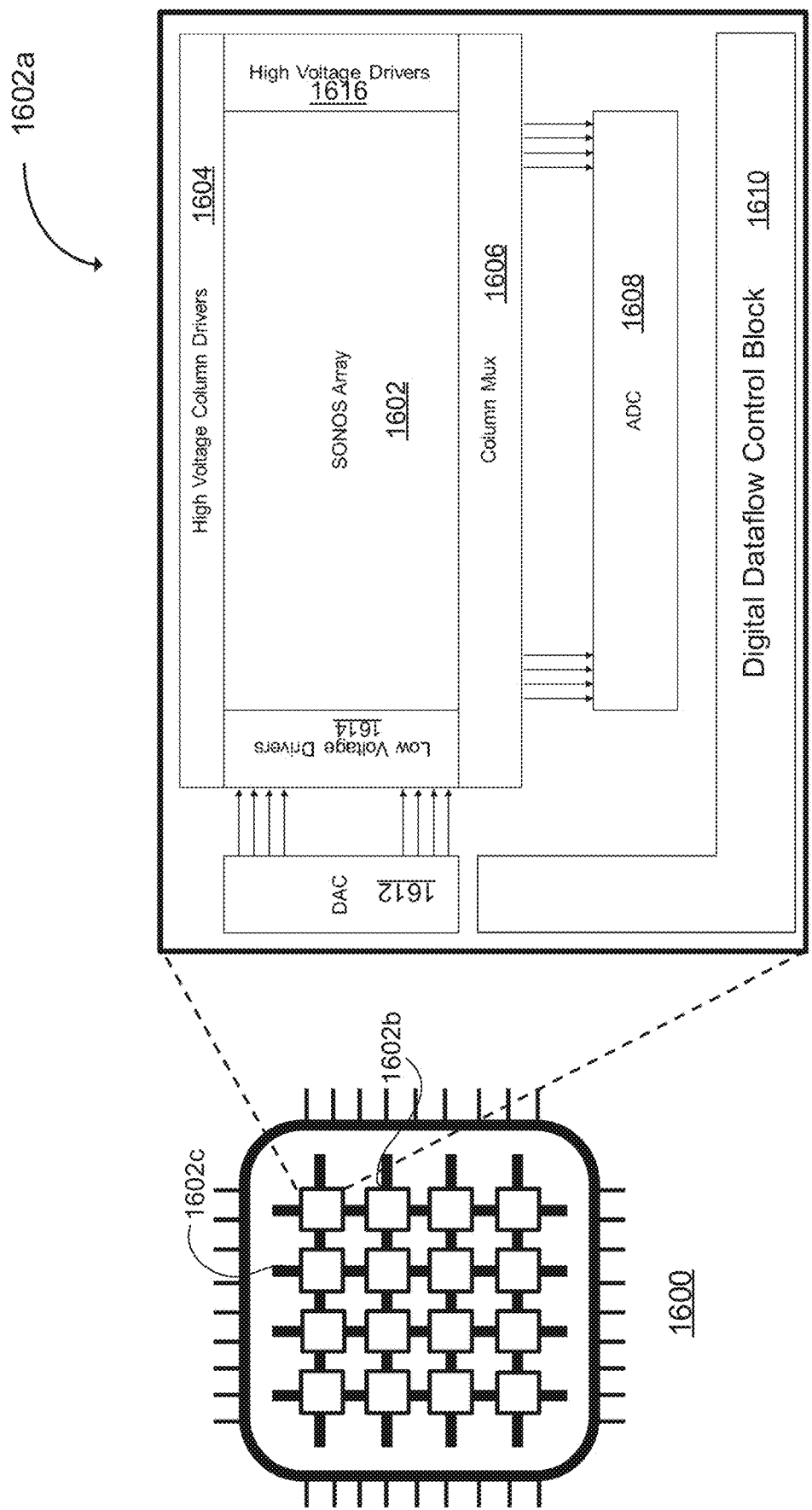
FIG. 16 is a schematic diagram illustrating an embodiment of an analog neuron network (NN) accelerator device according to the present disclosure.

FIG. 16 is a representative block diagram illustrating a neural network accelerator system in accordance with one embodiment of the present disclosure. In one embodiment, SONOS based analog devices may have the unique ability to store analog values of weights locally and process each non-volatile memory element in parallel, which may significantly eliminate massive data movement energy expenditure as illustrated in FIG. 14. Each NVM cell may have multiple levels (e.g. 4 bit-8 bit) instead of binary levels (1 bit), and each $I_D/V_T$ level may represent a multi-bit weight value (wi in FIG. 15) for making an inference. In one embodiment, the higher the number of levels, the higher the training accuracy and the lower the inference error rates. Key performance and reliability requirements for a typical analog memory for neuromorphic computing are sigma of cell $I_D/V_T$, retention, and noise at all levels. As previously explained, SONOS based NVM devices, such as multi-level NVM device 1300 in FIG. 13 may be a good candidate to perform both storage and inference functionalities of an artificial neuron in a DNN system.

Referring to FIG. 16, neural network accelerator system 1600 may include multiple multi-level NVM devices or accelerators 1602 disposed in a single substrate or package or die, coupled to one another via a bus system. Each accelerator 1602 may resemble the multi-level NVM device 1300 in FIG. 13 and be operated similarly. In one embodiment, multi-level NVM device 1602 may be configured to perform MAC operations. Each multi-level NVM device 1602 may function as the artificial neuron 1504 in FIG. 15 in a DNN system. In one embodiment, SONOS array 1602 may have multiple SONOS based multi-level NVM cells (not shown in FIG. 16) arranged in rows and columns. In other embodiments, SONOS array 1602 may include multiple SONOS multi-level NVM sections or arrays. Each multi-level NVM cell may be configured to store a weight value of 0 to $2^n-1$ or other values that are written using the write algorithm featuring a series of partial program and erase operations, as explained in earlier sections. In other embodiments, the analog value of each multi-level NVM cell may be written by other write algorithms.

As part of neuromorphic computing algorithm, each multi-level NVM device 1602, such as accelerator 1602a may perform the following MAC function, wherein xi are inputs from other multi-level NVM device(s) 1602 or external devices, wi is the stored weight values, b is a constant, and $f$ is an activation function:

$$f(\Sigma_i xiwi+b) \quad (1)$$

As best shown in FIG. 16, xi may be digital inputs from multi-level NVM devices 1602b and 1602c or other multi-level NVM device(s). Digital inputs xi may then be converted to analog signals by DAC 1612, which may then be coupled to low voltage drivers 1614 and/or high voltage drivers 1616. In one embodiment, low voltage drivers may generate control signals via WLs to control SGs of multi-level NVM cells corresponding to the received signals from DAC 1612. High voltage column drivers 1604 may generate control signals to BLs and high voltage drivers to WLSs to control CGs of multi-level NVM cells.

One embodiment of MAC operations in multi-level NVM device 1602a may be illustrated using the example in FIG. 13, wherein i may be set to 3. Referring to FIG. 13, digital inputs xi may be coupled to DAC 1320-1326 and x1=3, x2=5, x3=1. The selected weight values are stored in bits in Row A, Col. X (w1=10), Row B, Col. X (w2=8), and Row C, Col. Z (w3=2). The weight value selection may be based on the addresses received from other multi-level NVM devices 1602 or from external devices, such as processors, CPU, GPU, etc. The constant b may be selected to be the analog value stored in Row A, Col. Y (b=5). In order to compute x1×w1, Row A and Col. X (stored value=10) may be selected for a read. The read may be repeated for x1=3 times to compute x1×w1. Similarly, Row B, Col. X (weight value=8) may be selected for x2=5 reads to compute x2×w2 and Row C, Col. Z (weight value=2) for x3=1 read to compute x3×w3. Alternatively, Row A and B, Col. X may be both selected for read for 3 times (to accumulate combined weight values), and only Row A, Col. X may be selected for an extra 2 reads. Then the bit at Row A, Col. Y (b=5) may be selected for a read. As previously explained, column mux 1304 or 1606 may be configured to add those results together in order to compute the MAC result as 3×10+5×8+1×2+2=74. It will be the understanding that the above algorithm is only one example of using SONOS based multi-level NVM devices, such as multi-level NVM device 1300 and 1602 to compute MAC results for explanatory purposes and should not be construed as limitations. MAC weight values (wi) may be stored, organized, and read in multiple ways to compute MAC results according to system design and requirements. In one embodiment, activation function ($f$) may be an algorithm to indicate or prioritize MAC outputs of multi-level NVM devices 1602 in the perspective of the entire neural network. For example, the MAC result of the previous example (result=74) may be considered not important and assigned a low priority. The output signal may be reduced or eliminated according to its priority and the execution may be carried out in column mux function 1606 or ADC 1608 in some embodiments.

Subsequently, in one embodiment, the MAC result in the form of an analog signal (may be converted to a digital signal by ADC 1306 or 1608. The digital signal may then be outputted to another or other multi-level NVM device(s) 1602 as xi for their own MAC operations. In one embodiment, similar to a DNN, neuromorphic computing performed by all multi-level NVM devices 1602 may be performed in parallel. The digital MAC outputs of each multi-level NVM device 1602 may be transmitted to other multi-level NVM devices as digital inputs. In some embodiments, the plurality of multi-level NVM devices 1602 may be divided into multiple subsets. The digital outputs of one subset of multi-level NVM devices 1602 may be propagated to the next subset without repeating. The digital output of the last subset may be outputted as the neuromorphic computing or machine learning results to external devices.

In one embodiment, command and control circuitry (not shown in FIG. 16) including digital dataflow control block 1610, may be programmable and configured to direct data flow traffic within analog NVM devices 1602. The command and control circuitry may also provide control over low and high voltage drivers 1614 and 1616 and high voltage column driver 1604 to provide various operation voltage signals to SONOS array 1602 via SONOS word lines, word lines, bit lines, CSL, etc., including and not limited to $V_{POS}$, $V_{SEPOS}$, $V_{RPPOS}$, $V_{NEG}$ $V_{SENEG}$, $V_{CSL}$, $V_{MARG}$, $V_{INHIB}$, etc. as depicted in at least FIGS. 3A, 3B, 12A, 12B.

It will be appreciated by those skilled in the art that neural network accelerator system 1600 and analog NVM devices 1602 in FIG. 16 have been simplified for the purpose of illustration, and not intended to be a complete description. In particular, multi-level NVM devices 1602 may include processing function(s), row decoder, column decoder, sense amplifiers or other comparators, and command and control circuitry that are not shown or described in detail herein.

Figure 17:
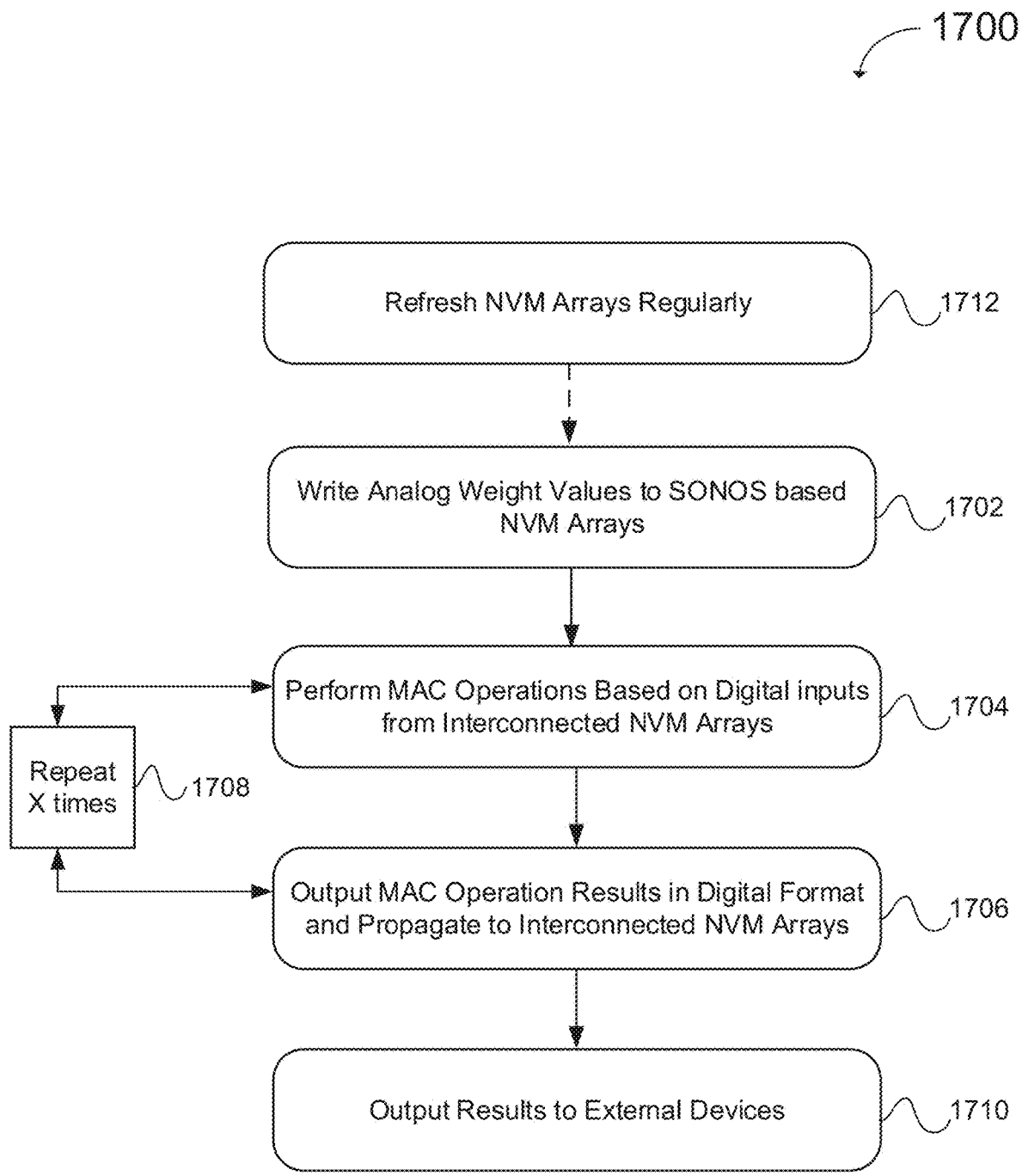
FIG. 17 is a schematic flowchart illustrating an embodiment of the method of operation of the NN accelerator device in FIG. 16 according to the present disclosure.

FIG. 17 is a representative flowchart illustrating an embodiment of method of operation of a NN accelerator system 1600 featuring SONOS based NVM arrays/cells according to the present disclosure. In one embodiment, analog weight values (wi) and other constant values (e.g. b) are written to the SONOS based NVM arrays in the NN accelerator using methods described previously, in step 1702. In some embodiments, the NVM arrays may be refreshed on a regular basis for better retention and narrow $I_D/V_T$ sigma, in optional step 1712. Subsequently, NVM arrays of one accelerator may be configured to perform MAC operations based on at least digital inputs (xi) from other accelerators and its stored weight values, in step 1704. After MAC operations are completed, one accelerator may output its results and propagated to one or more connected accelerator as digital inputs of their own MAC operations, in step 1706. In one embodiment, steps 1704 and 1706 may be repeated for many times and in parallel mode. In step 1710, outputs may be transmitted to external devices, such as CPUs, GPUs, as results of neuromorphic computation in machine learning of an AI application.

Thus, embodiments of a SONOS based multi-level non-volatile memory and methods of operating the same as analog memory device and MAC device in a neuromorphic computing system, such as DNN have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A semiconductor device, comprising:
   a silicon-oxide-nitride-oxide-silicon (SONOS) based non-volatile memory (NVM) array including charge-trapping memory cells arranged in rows and columns and configured to store one of N×analog values, wherein N is a natural number greater than 2, and wherein each charge-trapping memory cell includes:
   a memory transistor including an angled lightly doped drain (LDD) implant in source and drain regions, wherein the angled LDD implant extends at least partly under an oxide-nitride-oxide (ONO) layer of the memory transistor, and wherein the ONO layer disposed within the memory transistor and over an adjacent isolation structure has a substantially same elevation, wherein the N×analog values correspond to the N×threshold voltage ($V_T$) levels of the memory transistor.

2. The semiconductor device of claim 1, wherein the each charge-trapping memory cell further comprises:
   a select transistor including a shared source region, wherein the shared source region is shared between two adjacent charge-trapping memory cells of a same row of the SONOS based NVM array.

3. The semiconductor device of claim 1, wherein the N×analog values stored in the charge-trapping memory cell correspond to the N×drain current ($I_D$) levels of the memory transistor.

4. The semiconductor device of claim 3, wherein the N×$I_D$ levels are linearly incremental and the N×$V_T$ levels are linearly decremental.

5. The semiconductor device of claim 3, wherein two adjacent distributions of the N×$I_D$ levels have an overlapping frequency of less than 3%.

6. The semiconductor device of claim 3, wherein the angled LDD implant of the memory transistor comprises dopant dose in an approximate range of 1e12-1e15 atoms per cm$^2$ of phosphorus so as to minimize gate induced drain leakage (GIDL) current and drain current ($I_D$) and threshold voltage ($V_T$) distribution sigma of the memory transistor.

7. The semiconductor device of claim 1, wherein the ONO layer of the memory transistor includes a blocking dielectric layer, a charge trapping layer, and a tunnel oxide layer, wherein:
the blocking dielectric layer is formed by a first in-situ steam generation (ISSG) process such that interface charge traps between the blocking dielectric and the charge trapping layer are minimized; and
the tunnel oxide layer is formed by a second ISSG process such that interface charge traps between the tunnel oxide layer and a substrate, and between the tunnel oxide layer and the charge trapping layer are minimized.

8. The semiconductor device of claim 1, wherein the charge trapping layer comprises an upper charge trapping layer disposed over a lower charge trapping layer, wherein:
the upper charge trapping layer is formed by a first chemical vapor deposition (CVD) process using a process gas including DCS/NH$_3$ mixture and N$_2$O/NH$_3$ gas mixture at first flow rates; and
the lower charge trapping layer is formed by a second CVD process using the process gas including DCS/NH$_3$ mixture and N$_2$O/NH$_3$ gas mixture at second flow rates, wherein the first flow rate of the N$_2$O/NH$_3$ gas mixture in the first CVD process is increased while the second flow rate of the DCS/NH$_3$ is reduced to minimize a concentration of shallow charge traps in the charge trapping layer.

9. The semiconductor of claim 1, wherein the adjacent isolation structure is a shallow trench isolation (STI) separating two rows of the charge-trapping memory cells, and wherein there is no divot in an interface area between the memory transistor and the STI.

10. The semiconductor of claim 9, wherein the tunnel oxide that is formed by a second ISSG process has a uniform thickness around a corner region between the STI and the charge-trapping memory cells.

11. The semiconductor of claim 1, wherein the one of N×analog values stored in the charge-trapping memory cells are written by a series of partial program operations and partial erase operations using Fowler-Nordheim tunneling.

12. The semiconductor device of claim 1, wherein the ONO layer comprises a blocking dielectric layer including a high K dielectric layer.

13. The semiconductor device of claim 12, wherein a metal gate layer is disposed over the high K dielectric layer.

14. A semiconductor device, comprising:
a silicon-oxide-nitride-oxide-silicon (SONOS) based non-volatile memory (NVM) array configured to function as an inference device, including multi-level memory cells, wherein each multi-level memory cell includes a memory transistor including an angled lightly doped drain (LDD) implant extends at least partly under an oxide-nitride-oxide (ONO) layer of the memory transistor, and wherein the ONO layer disposed within the memory transistor and over an adjacent isolation structure has a substantially same elevation;
digital-to-analog (DAC) function configured to receive and convert digital signals from external devices, wherein the digital signals converted cause analog value stored in at least one multi-level memory cell in at least one column to be read;
column multiplexor (mux) function configured to perform inferencing operations using the analog value stored in the at least one multi-level memory cell; and
analog-to-digital (ADC) function configured to convert analog results of the inferencing operations from the column mux function to digital values.

15. The semiconductor device of claim 14, wherein multi-level memory cells in a same row share a SONOS word line, multi-level memory cells in a same column share a bit line, and multi-level memory cells in two adjacent columns couple to a common source line.

16. The semiconductor device of claim 14, wherein the multi-level memory cells are configured to store one of N×analog values, wherein N is a natural number greater than 2, and wherein the N×analog values correspond to N×drain current ($I_D$) levels and N×threshold voltage ($V_T$) levels of the memory transistors, respectively.

17. The semiconductor device of claim 14, wherein the adjacent isolation structure is a shallow trench isolation (STI) separating two rows or two columns of the multi-level memory cells, and wherein there is no divot in a contact area between the memory transistor and the STI.

18. The semiconductor device of claim 14, wherein the angled LDD implant of the memory transistor comprises dopant dose in an approximate range of 1e12-1e15 atoms per cm2 of phosphorus.

19. The semiconductor device of claim 14, wherein the ONO layer comprises a blocking dielectric layer including a high K dielectric layer, and wherein a metal gate layer is disposed over the high K dielectric layer.

20. A system, comprising:
a plurality of multi-level non-volatile memory (NVM) devices, wherein each multi-level NVM device includes:
a silicon-oxide-nitride-oxide-silicon (SONOS) based array including memory cells configured to store one of N×analog values, wherein N is a natural number greater than 2, wherein each of the memory cells comprises a memory transistor including an angled lightly doped drain (LDD) implant extends at least partly under an oxide-nitride-oxide (ONO) layer of the memory transistor, and wherein a blocking oxide layer and a tunnel oxide layer of the ONO layer are formed by an in-situ steam generation (ISSG) process to minimize interface charge traps;
digital-to-analog (DAC) function configured to receive and convert digital signals from at least one other multi-level NVM device in the system;
column multiplexor (mux) function configured to perform inferencing operations using analog values stored in the memory cells and the digital signals converted; and
analog-to-digital (ADC) function configured to convert analog results of the inferencing operations from the column mux function to digital values; and
a bus system coupling the plurality of multi-level NVM devices to one another.

21. The system of claim 20, wherein the N×analog values stored in the memory cells correspond to the N×drain current ($I_D$) levels and N×threshold voltage ($V_T$) levels of the memory transistors.

22. The system of claim 20, wherein the ONO layer disposed within the memory transistor and over an adjacent isolation structure has a substantially same elevation, wherein the adjacent isolation structure is a shallow trench isolation (STI) separating two rows or columns of the memory cells, and wherein there is no divot in a contact area between the memory transistor and the STI.

23. The system of claim 20, wherein each of the plurality of multi-level NVM devices is configured to perform as an artificial neuron of a deep neural network (DNN) and the inferencing operations include multiply accumulate (MAC) operations.

24. The system of claim 20, wherein the plurality of multi-level non-volatile memory (NVM) devices and the bus system are disposed in a single semiconductor die.

\* \* \* \* \*